United States Patent
Sakurai et al.

(10) Patent No.: US 12,424,459 B2
(45) Date of Patent: Sep. 23, 2025

(54) SUBSTRATE PROCESSING APPARATUS AND SUBSTRATE PROCESSING METHOD

(71) Applicant: Tokyo Electron Limited, Tokyo (JP)

(72) Inventors: Hiroki Sakurai, Kumamoto (JP); Yenrui Hsu, Kumamoto (JP); Shoki Mizuguchi, Kumamoto (JP); Nobuhiro Ogata, Kumamoto (JP); Shinichi Umeno, Kumamoto (JP); Kazuya Goda, Kumamoto (JP); Minsung Kim, Kumamoto (JP); Hiroyuki Higashi, Kumamoto (JP)

(73) Assignee: TOKYO ELECTRON LIMITED., Tokyo (JP)

( * ) Notice: Subject to any disclaimer, the term of this patent is extended or adjusted under 35 U.S.C. 154(b) by 0 days.

(21) Appl. No.: 18/215,184

(22) Filed: Jun. 28, 2023

(65) Prior Publication Data
US 2024/0021445 A1    Jan. 18, 2024

(30) Foreign Application Priority Data
Jul. 14, 2022 (JP) ................. 2022-112964

(51) Int. Cl.
*H01L 21/67* (2006.01)
*B05B 7/04* (2006.01)
(Continued)

(52) U.S. Cl.
CPC ...... *H01L 21/67051* (2013.01); *B05B 7/0416* (2013.01); *H01L 21/02057* (2013.01);
(Continued)

(58) Field of Classification Search
CPC ....... H01L 21/00–86; H01L 21/67017–67086; G03F 7/42; G03F 7/422
See application file for complete search history.

(56) References Cited

U.S. PATENT DOCUMENTS

2003/0079764 A1 * 5/2003 Hirose ............. H01L 21/67051
134/144
2003/0178047 A1 * 9/2003 Hirae ............... H01L 21/67051
134/103.3
(Continued)

FOREIGN PATENT DOCUMENTS

JP 2014-027245 A 2/2014
KR 20180000072 A * 1/2018

*Primary Examiner* — Kaj K Olsen
*Assistant Examiner* — Richard Z. Zhang
(74) *Attorney, Agent, or Firm* — XSENSUS LLP

(57) ABSTRACT

A substrate processing apparatus according to the present disclosure includes a substrate holding unit, a fluid supplying unit, a processing-liquid supplying unit, a nozzle, a fluid amount adjusting unit, and a controller. The substrate holding unit holds a substrate to be rotatable. The fluid supplying unit supplies fluid including pressurized vapor or mist of deionized water. The processing-liquid supplying unit supplies processing liquid including at least a sulfuric acid. The nozzle is connected to the fluid supplying unit and the processing-liquid supplying unit to discharge mixed fluid of the fluid and the processing liquid toward the substrate. The fluid amount adjusting unit adjusts a flow volume of the fluid that is flowing through the fluid supplying unit. The controller controls the fluid amount adjusting unit to adjust a ratio of the fluid to the processing liquid.

19 Claims, 12 Drawing Sheets

(51) Int. Cl.
*H01L 21/02* (2006.01)
*H01L 21/687* (2006.01)

(52) U.S. Cl.
CPC .... *H01L 21/6708* (2013.01); *H01L 21/67248* (2013.01); *H01L 21/68764* (2013.01)

(56) References Cited

U.S. PATENT DOCUMENTS

| | | | |
|---|---|---|---|
| 2004/0087158 A1* | 5/2004 | Izumi | B08B 3/02 |
| | | | 257/E21.228 |
| 2007/0045231 A1* | 3/2007 | Wada | H01L 21/6708 |
| | | | 438/689 |
| 2007/0141849 A1* | 6/2007 | Kanno | B05B 7/0433 |
| | | | 347/65 |
| 2008/0173327 A1* | 7/2008 | Miyagi | B05B 7/0433 |
| | | | 204/661 |
| 2008/0283090 A1* | 11/2008 | DeKraker | H01L 21/31133 |
| | | | 134/28 |
| 2013/0014784 A1* | 1/2013 | Ito | H01L 21/67051 |
| | | | 134/30 |
| 2013/0203262 A1* | 8/2013 | Butterbaugh | B81C 1/00539 |
| | | | 438/748 |
| 2013/0340796 A1* | 12/2013 | Kawano | H01L 21/02057 |
| | | | 134/28 |
| 2018/0090306 A1* | 3/2018 | Higashijima | H01L 21/67051 |
| 2018/0190517 A1* | 7/2018 | DeKraker | H01L 21/67253 |
| 2019/0308224 A1* | 10/2019 | Hayashi | B01F 23/49 |
| 2023/0271228 A1* | 8/2023 | Yoon | B08B 1/12 |
| | | | 134/102.1 |

* cited by examiner

SUBSTRATE PROCESSING APPARATUS AND SUBSTRATE PROCESSING METHOD

CROSS-REFERENCE TO RELATED APPLICATION

The present application claims priority to and incorporates by reference the entire contents of Japanese Patent Application No. 2022-112964 filed in Japan on Jul. 14, 2022.

FIELD

Exemplary embodiment disclosed herein relates to a substrate processing apparatus and a substrate processing method.

BACKGROUND

In a manufacturing process of a semiconductor device, there has been known a technology that supplies processing liquid to a substrate such as a semiconductor wafer so as to remove a removal target, such as a resist film, from the substrate (see Japanese Patent Application Laid-open No. 2014-027245, for example).

A substrate processing apparatus according to one aspect of the present disclosure includes a substrate holding unit, a fluid supplying unit, a processing-liquid supplying unit, a nozzle, a fluid amount adjusting unit, and a controller. The substrate holding unit holds a substrate to be rotatable. The fluid supplying unit supplies fluid including pressurized vapor or mist of deionized water. The processing-liquid supplying unit supplies processing liquid including at least a sulfuric acid. The nozzle is connected to the fluid supplying unit and the processing-liquid supplying unit to discharge mixed fluid of the fluid and the processing liquid toward the substrate. The fluid amount adjusting unit adjusts a flow volume of the fluid that is flowing through the fluid supplying unit. The controller controls the fluid amount adjusting unit to adjust a ratio of the fluid to the processing liquid.

SUMMARY

DESCRIPTION OF EMBODIMENTS

Figure 1:
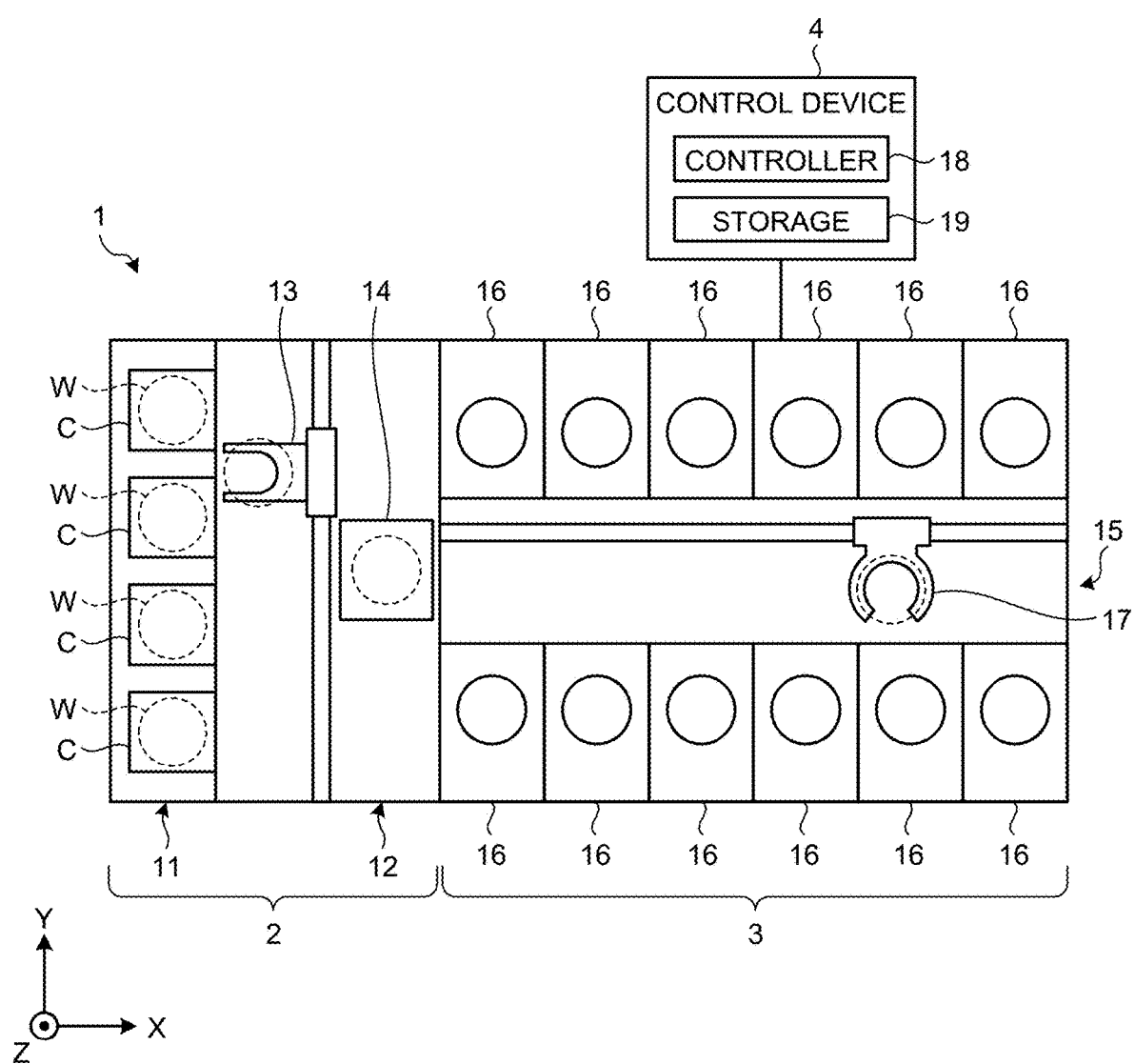
FIG. 1 is a diagram illustrating a schematic configuration of a substrate processing system according to an embodiment.

Hereinafter, modes (hereinafter, may be referred to as "embodiments") for carrying out a substrate processing apparatus and a substrate processing method according to the present disclosure will be described in detail with reference to accompanying drawings. In addition, the present disclosure is not limited to the embodiments described below. Moreover, any of these embodiments may be appropriately combined within a consistent range. In the following explanation, parts similar to those having been already explained are provided with the same reference symbols as those of the already-explained parts, and duplicated explanation is appropriately omitted.

Furthermore, expressions of "constant", "perpendicular", "vertical", and "parallel" used in the following embodiments are not necessarily identical to "constant", "perpendicular", "vertical", and "parallel" strictly. In other words, the above-mentioned expressions may include a divergence caused by, for example, manufacturing accuracy, installation accuracy, and the like.

In the drawings referred herein, an X-axis direction, a Y-axis direction, and a Z-axis direction that are perpendicular to each other are defined, and a rectangular coordinate system having a Z-axis positive direction as the upward vertical direction may be indicated for better understandings.

In a manufacturing process of a semiconductor device, a resist film is formed on a film to be processed that is formed on a substrate, such as a semiconductor wafer. Processes of an etching, an ion implantation, and the like are performed on the film to be processed while using the resist film as a mask. The resist film, which is not necessary after completion of the processes, is removed from the wafer.

Sulfuric acid-hydrogen peroxide mixture cleaning (hereinafter, may referred to as "SPM cleaning") is used for removing the resist film. The SPM cleaning is performed by supplying high temperature sulfuric acid-hydrogen peroxide mixture obtained by mixing a sulfuric acid and a hydrogen peroxide to the resist film.

A substrate processing apparatus and a substrate processing method will be explained in the following embodiments, capable of improving within wafer non-uniformity in removing a removal target on the wafer surface in the SPM cleaning.

A substrate processing apparatus according to the present disclosure is applicable to liquid processing other than the SPM cleaning. Specifically, a substrate processing apparatus according to the present disclosure is applicable to liquid processing using processing liquid including at least sulfuric acid.

The above-mentioned "processing liquid including at least sulfuric acid" may be, for example, processing liquid that reacts, when being mixed with sulfuric acid, with the sulfuric acid so as to invoke a raise in temperature or increase in an etchant. Specifically, it may be dilute sulfuric acid that is mixed solution obtained by mixing sulfuric acid and water, mixed solution obtained by mixing sulfuric acid and ozonated water, or the like. The above-mentioned "processing liquid including at least sulfuric acid" may be sulfuric acid.

Outline of Substrate Processing System

A schematic configuration of a substrate processing system 1 according to the embodiment will be explained with reference to FIG. 1. FIG. 1 is a drawing illustrating the schematic configuration of the substrate processing system 1 according to the embodiment. It's to be noted that the substrate processing system 1 is an example of the substrate processing apparatus.

As illustrated in FIG. 1, the substrate processing system 1 includes a carry-in/out station 2 and a processing station 3. The carry-in/out station 2 is placed to be adjacent to the processing station 3.

The carry-in/out station 2 includes a carrier placing section 11 and a transfer section 12. In the embodiment, a plurality of carriers C is placed on the carrier placing section 11, each of which accommodates therein a plurality of substrates that is semiconductor wafers W (hereinafter, referred to as "wafer W") with a horizontal state.

The transfer section 12, which is adjacent to the carrier placing section 11, includes therein a substrate transfer device 13 and a delivery unit 14. The substrate transfer device 13 includes a wafer holding mechanism for holding the wafer W. The substrate transfer device 13 is capable of moving in a horizontal direction and the vertical direction and turning around a vertical axis, and transfers the wafer W between the carrier C and the delivery unit 14 by using the wafer holding mechanism.

The processing station 3 is provided adjacent to the transfer section 12. The processing station 3 includes a transfer section 15 and a plurality of process units 16. The process unit 16 is an example of the substrate processing unit. The plurality of process units 16 is set side by side on both sides of the transfer section 15.

The transfer section 15 includes a substrate transfer device 17. The substrate transfer device 17 includes a wafer holding mechanism for holding the wafer W. The substrate transfer device 17 is capable of moving in a horizontal direction and the vertical direction and turning around a vertical axis, and transfers the wafer W between the delivery unit 14 and the process unit 16 by using the wafer holding mechanism.

The process units 16 perform predetermined substrate processing on the wafer W to be transferred by the substrate transfer device 17. More details of the process units 16 will be described hereinafter.

The substrate processing system 1 includes a control device 4. The control device 4, such as a computer, includes a controller 18, such as a central processing unit, and a storage 19, such as a memory including RAM or ROM. The storage 19 stores therein a program for controlling various kinds of processing to be executed by the substrate processing system 1. The controller 18 reads and executes a program stored in the storage 19 so as to control operations of the substrate processing system 1.

The above-mentioned program may be recorded in a computer-readable storage medium and installed in the storage 19 of the control device 4 from the computer-readable storage medium. The computer-readable storage medium may be, for example, a hard disk, a flexible disk, a compact disk, a magnet optical disk, a memory card, or the like.

According to the above described substrate processing system 1, the substrate transfer device 13 of the carry-in/out station 2 picks up the wafer W from the carrier C placed on the carrier placing section 11, and places the picked up wafer W on the delivery unit 14. The wafer W placed on the delivery unit 14 is taken out from the delivery unit 14 by the substrate transfer device 17 of the processing station 3, and is transferred to the process unit 16.

The wafer W transferred to the process unit 16 is transferred from the process unit 16 by the substrate transfer device 17 after being processed by the process unit 16, and is placed on the delivery unit 14. The processed wafer W placed on the delivery unit 14 is returned to the carrier C of the carrier placing section 11 by the substrate transfer device 13.

Configuration of Process Unit

Figure 2:
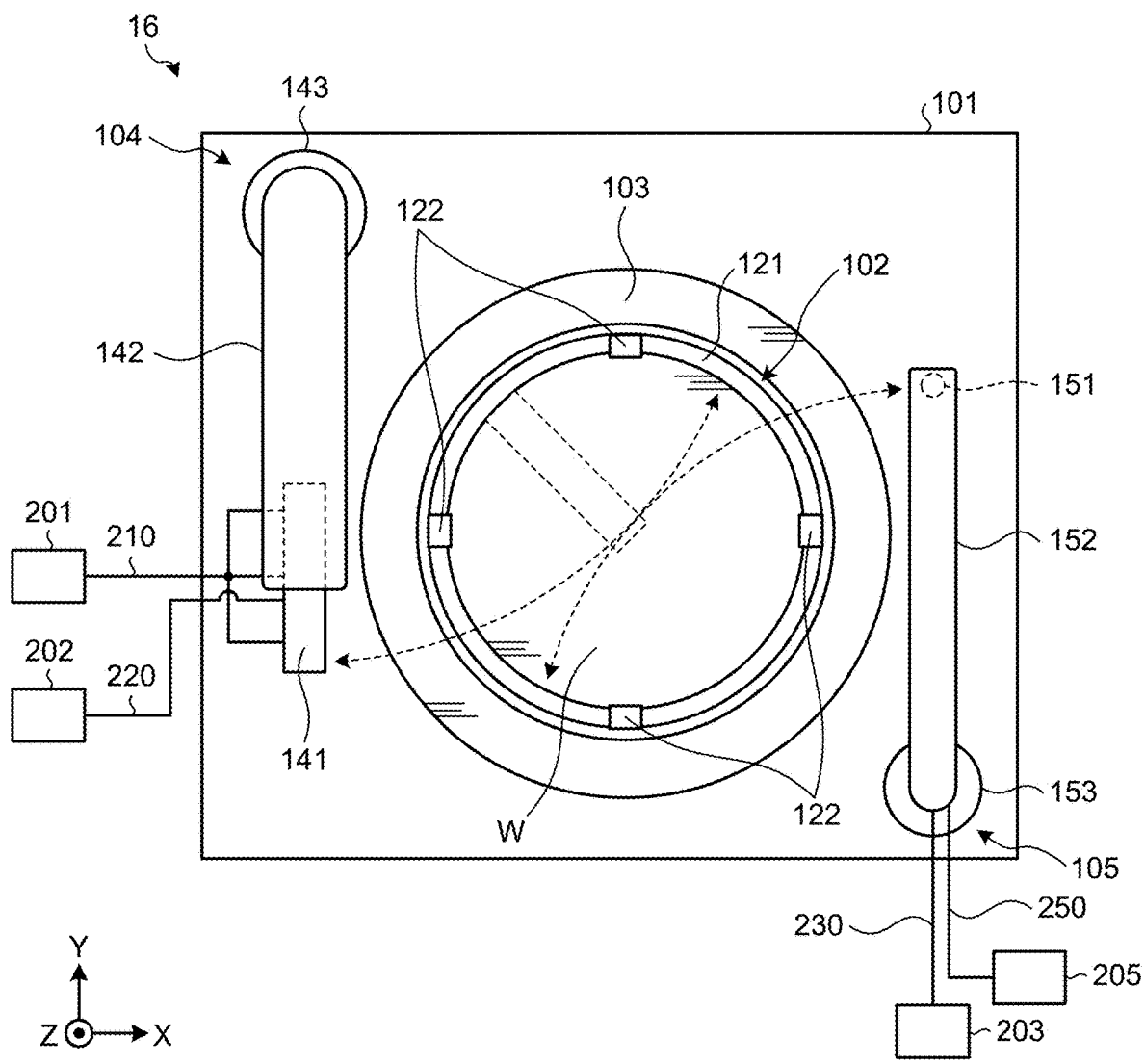
FIG. 2 is a schematic plan view illustrating a substrate processing apparatus according to the embodiment.
Figure 3:
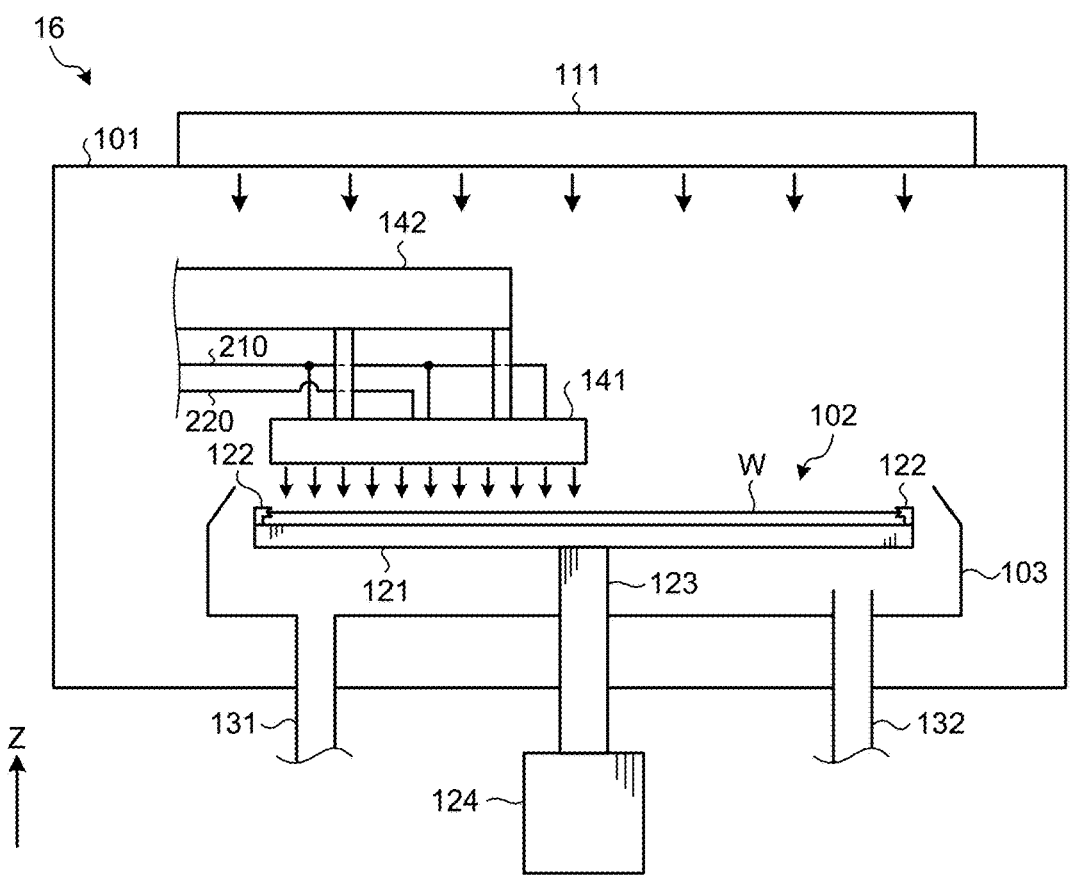
FIG. 3 is a schematic side view illustrating the substrate processing apparatus according to the embodiment.

A configuration of the process unit according to the embodiment will be explained with reference to FIG. 2 and FIG. 3. FIG. 2 is a schematic plan view illustrating the substrate processing apparatus according to the embodiment. FIG. 3 is a schematic side view illustrating the substrate processing apparatus according to the embodiment.

As illustrated in FIG. 2 and FIG. 3, the process unit 16 includes a chamber 101, a substrate holding unit 102, a cup part 103, a first supply mechanism 104, and a second supply mechanism 105. The process unit 16 also includes a vapor supplying unit 201 (one example of fluid supplying unit), an SPM supplying unit 202 (one example of processing-liquid supplying unit), a DIW supply source 203, and a hydrogen peroxide supply source 205.

A removal efficiency of a resist film can be improved by raising the temperature of SPM liquid. As a method for raising the temperature of SPM liquid, raising the temperature of sulfuric acid may be employed as one example. However, in order to raise the temperature of sulfuric acid, it is necessary to improve heat resistance and pressure resistance of a pipe through which sulfuric acid flows. Such improvement requires a large load to hardware. As a method for raising the temperature of SPM liquid, increasing the ratio of hydrogen peroxide by changing the ratio of sulfuric acid and hydrogen peroxide may be employed as another example. However, such increase in the ratio of hydrogen peroxide may cause fume and bumping. Other options, such as heating SPM liquid on the wafer W by using an infrared heater or the like, may cause problems in terms of the temperature stability, for example.

According to the embodiment, the process unit 16 is configured to mix SPM liquid with pressurized vapor of pure water or deionized water (hereinafter referred to as "vapor"). Accordingly, it is possible to suitably raise the temperature of SPM liquid.

A chamber 101 accommodates therein the substrate holding unit 102, the cup part 103, the first supply mechanism 104, and the second supply mechanism 105. A Fun Filter Unit (FFU) 111, which forms a down-flow in the chamber 101, is provided in a ceiling portion of the chamber 101 (see FIG. 3).

The substrate holding unit 102 holds the wafer W to be rotatable. Specifically, the substrate holding unit 102 includes a body part 121 having a diameter larger than that of the wafer W, a plurality of gripping units 122 provided on an upper surface of the body part 121, a column member 123 for supporting the body part 121, and a drive unit 124 for rotating the column member 123. The number of the gripping units 122 is not limited to the one illustrated in the drawings.

The substrate holding unit 102 holds the wafer W by gripping the periphery of the wafer W with the use of the plurality of gripping units 122. Accordingly, the wafer W is horizontally held with a state that the wafer W is slightly separated from the upper surface of the body part 121. As described in the above, the resist film is formed on the upper surface of the wafer W.

Although the example of the substrate holding unit 102 for holding the periphery of the wafer W by using the plurality of gripping units 122 is exemplified in the embodiment, the process unit 16 may have a vacuum chuck for sucking and holding a back surface of the wafer W instead of the substrate holding unit 102.

The cup part 103 is arranged to surround the substrate holding unit 102. A drain port 131 for draining processing liquid supplied to the wafer W from the chamber 101 to outside thereof and an exhaust port 132 for exhausting the atmosphere in the chamber 101 are formed in a bottom portion of the cup part 103.

A first supply mechanism 104 includes a nozzle 141, a first arm 142, and a first turning/lifting mechanism 143. The first arm 142 extends in the horizontal direction to support the nozzle 141 from above. The first turning/lifting mechanism 143 rotates, lifts up and lifts down the first arm 142. According to the first turning/lifting mechanism 143, the first arm 142 is capable of moving the nozzle 141 between the processing position above the wafer W and a standby position in the outside of the wafer W.

The nozzle 141 is a long nozzle that linearly extends along the horizontal direction. A length of the nozzle 141 is about the same size as a radius of the wafer W. A tip of the nozzle 141 in a longitudinal direction thereof is located above the center portion of the wafer W. A bottom end of the nozzle 141 in the longitudinal direction thereof is located above the periphery of the wafer W.

The nozzle 141 is connected to the vapor supplying unit 201 via a vapor supplying route 210. The nozzle 141 is also connected to the SPM supplying unit 202 via an SPM supplying route 220. The vapor supplying unit 201 supplies the vapor, which is a pressurized vapor of pure water (namely, deionized water), to the nozzle 141 via the vapor supplying route 210. The SPM supplying unit 202 supplies SPM liquid, which is mixed solution of sulfuric acid and hydrogen peroxide, to the nozzle 141 via the SPM supplying route 220. Any known technologies may be used to configure the SPM supplying unit 202. For example, the SPM supplying unit 202 may include a sulfuric acid supply source for supplying sulfuric acid, a hydrogen peroxide supply source for supplying hydrogen peroxide, and a mixing unit for mixing sulfuric acid and hydrogen peroxide. The SPM supplying unit 202 may be capable of supplying sulfuric acid instead of SPM liquid. A configuration of the vapor supplying unit 201 will be described hereinafter.

The nozzle 141 mixes vapor supplied from the vapor supplying unit 201 with SPM liquid supplied from the SPM supplying unit 202, and discharges the mixture to the wafer W. A specific configuration of the nozzle 141 will be described hereinafter.

The second supply mechanism 105 includes a rinse nozzle 151, a second arm 152, and a second turning/lifting mechanism 153. The second arm 152 extends in the horizontal direction for supporting the rinse nozzle 151 from above. The second turning/lifting mechanism 153 rotates, lifts up and lifts down the second arm 152. According to the second turning/lifting mechanism 153, the second arm 152 is capable of moving the rinse nozzle 151 between the processing position above the wafer W and the standby position at the outside of the wafer W.

The rinse nozzle 151 is connected to the DIW supply source 203 via a DIW supplying route 230. The rinse nozzle 151 discharges de-ionized water (hereinafter referred to as "DIW"), which is pure water, supplied from the DIW supply source 203 via the DIW supplying route 230 to the wafer W. The DIW supply source 203 supplies DIW to the rinse nozzle 151 via the DIW supplying route 230. Any known technologies may be used to configure the DIW supply source 203.

The rinse nozzle 151 is also connected to the hydrogen peroxide supply source 205 via a hydrogen peroxide supplying route 250. The rinse nozzle 151 discharges hydrogen peroxide supplied from the hydrogen peroxide supply source 205 via the hydrogen peroxide supplying route 250 to the wafer W. The hydrogen peroxide supply source 205 supplies hydrogen peroxide to the rinse nozzle 151 via the hydrogen peroxide supplying route 250. Any known technologies may be used to configure the hydrogen peroxide supplying route 250.

Configuration of Nozzle

Figure 4:
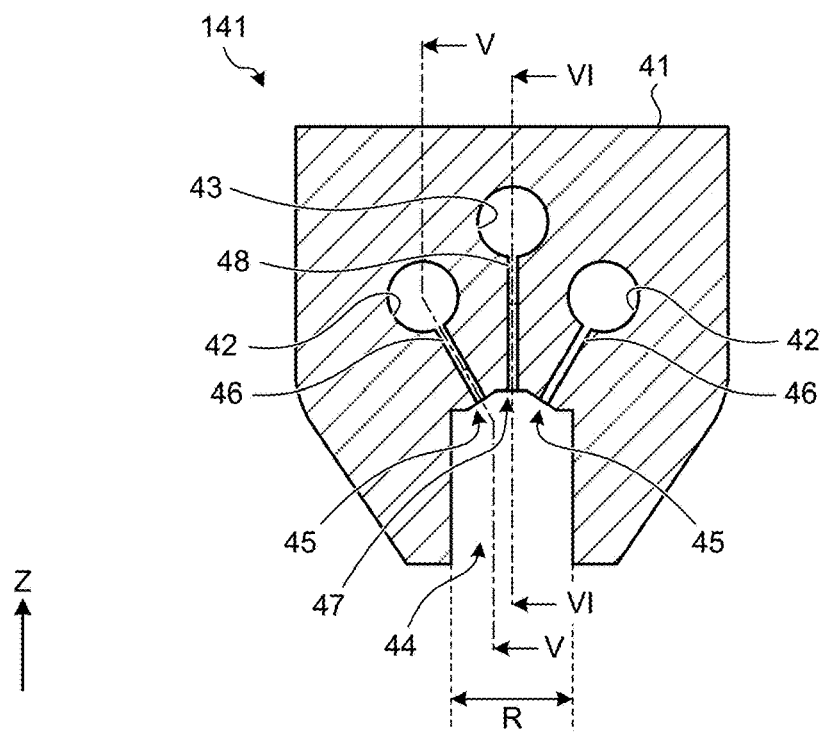
FIG. 4 is a cross-sectional view illustrating a cross section obtained by cutting by using a plane that is perpendicular to a longitudinal direction of the nozzle according to the embodiment.
Figure 5:
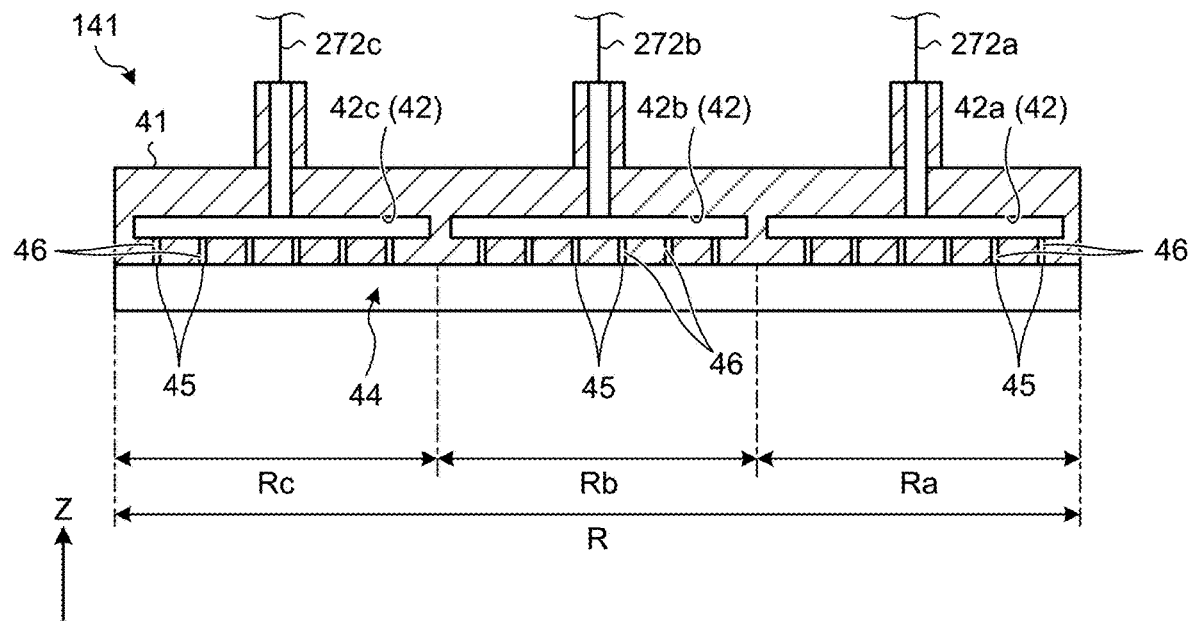
FIG. 5 is a diagram illustrating one example of a cross-sectional shape viewed along an arrow direction of V-V line in FIG. 4.
Figure 6:
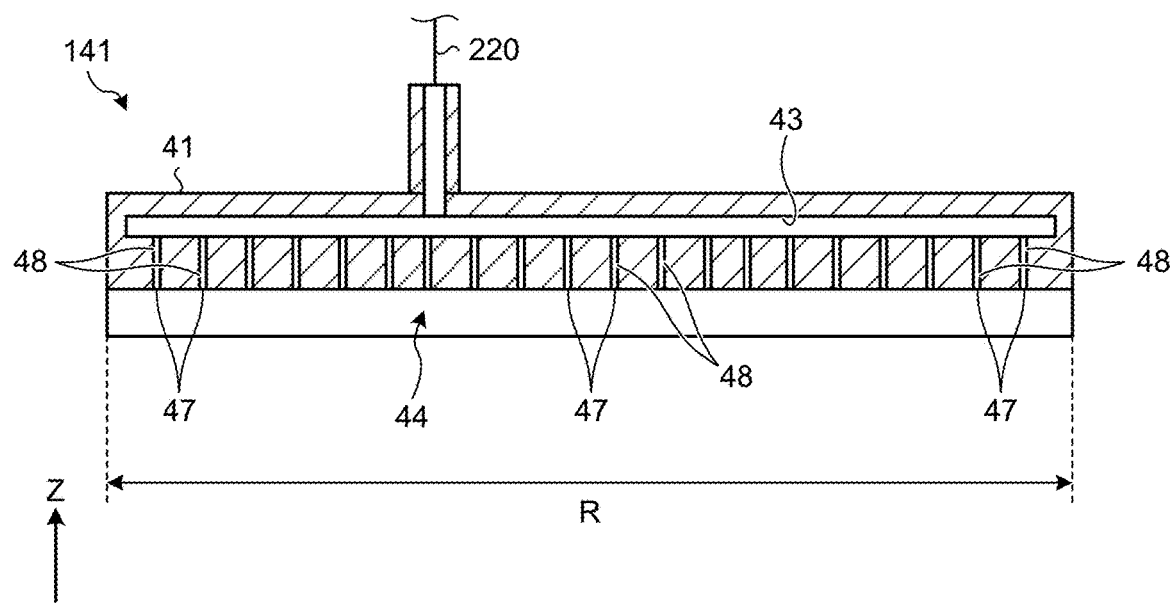
FIG. 6 is a diagram illustrating one example of a cross-sectional shape viewed along an arrow direction of VI-VI line in FIG. 3.

A configuration of the nozzle 141 according to the embodiment will be explained with reference to FIG. 4 to FIG. 6. FIG. 4 is a cross-sectional view illustrating a cross section obtained by cutting by using a plane that is perpendicular to a longitudinal direction of the nozzle 141 according to the embodiment. FIG. 5 is a diagram illustrating one example of a cross-sectional shape viewed along an arrow direction of V-V line in FIG. 4. FIG. 6 is a diagram illustrating one example of a cross-sectional shape viewed along an arrow direction of VI-VI line in FIG. 3.

As illustrated in FIG. 4, the nozzle 141 includes a nozzle body 41, a pair of first distributing routes 42, a second distributing route 43, and a delivery route 44. The first distributing route 42 and the second distributing route 43 are provided inside the nozzle body 41. Specifically, the second distributing route 43 is located on the center line, which is a line equally dividing the nozzle body 41 into two parts, in the cross sectional view of the nozzle body 41. The pair of first distributing routes 42 is respectively located on the left side and the right side of the second distributing route 43. The second distributing route 43 is one example of a processing liquid distributing route.

The nozzle 141 includes first discharge ports 45, first discharge routes 46, second discharge ports 47, and second discharge routes 48. As illustrated in FIG. 5, the first discharge ports 45 and the first discharge routes 46 are provided along the longitudinal direction of the nozzle 141. As illustrated in FIG. 6, the second discharge ports 47 and the second discharge routes 48 are provided along the longitudinal direction of the nozzle 141 as well.

The delivery route 44 is provided below the first distributing route 42 and the second distributing route 43. As illustrated in FIGS. 4 to 6, the delivery route 44 is a slit channel that is provided below the nozzle body 41 and that extends along the longitudinal direction of the nozzle body 41 and vertically therebelow. Both of side ends in the longitudinal direction of the delivery route 44 and a lower end of the delivery route 44 are open. The longitudinal direction of the delivery route 44 is the same direction as the longitudinal direction of the nozzle body 41.

The plurality of first discharge ports 45 and the plurality of second discharge ports 47 have openings in the upper surface of the delivery route 44. As illustrated in FIGS. 5 and 6, the plurality of first discharge ports 45 and the plurality of second discharge ports 47 are aligned along the longitudinal direction of the nozzle body 41. The plurality of first discharge ports 45 and the plurality of second discharge ports 47 are aligned substantially all over from one end to the other end along the longitudinal direction of the delivery route 44.

The plurality of first discharge ports 45 is connected to the first distributing route 42 via the plurality of first discharge routes 46. The plurality of second discharge ports 47 is connected to the second distributing route 43 via the plurality of second discharge routes 48.

As illustrated in FIG. 5, the first distributing route 42 is divided into a plurality of individual distributing routes 42a to 42c. The plurality of individual distributing routes 42a to 42c respectively correspond to a plurality of individual discharge regions Ra to Rc. The plurality of individual discharge regions Ra to Rc are formed by dividing a discharge region R along the longitudinal direction of the delivery route 44, which is almost entire region from one end to other end along the longitudinal direction of the delivery route 44. The longitudinal direction of the delivery route 44 is the extending direction of the nozzle 141. The individual discharge regions Ra to Rc respectively correspond to a center region, a middle region, and a peripheral region. More details will be explained hereinafter.

The individual distributing route 42a corresponds to the individual discharge region Ra. The individual distributing route 42a is connected to an individual supply route 272a to be explained hereinafter so as to distribute vapor supplied from the individual supply route 272a to whole region of the individual discharge region Ra.

The individual distributing route 42b corresponds to the individual discharge region Rb. The individual distributing route 42b is connected to an individual supply route 272b to be explained hereinafter so as to distribute vapor supplied from the individual supply route 272b to whole region of the individual discharge region Rb.

The individual distributing route 42c corresponds to the individual discharge region Rc. The individual distributing route 42c is connected to an individual supply route 272c to be explained hereinafter so as to distribute the vapor supplied from the individual supply route 272c to whole region of the individual discharge region Rc.

As illustrated in FIG. 6, the second distributing route 43 extends along the longitudinal direction of the nozzle body 41. The second distributing route 43 is connected to the SPM supplying route 220 so as to distribute SPM liquid supplied from the SPM supplying route 220 to whole region of the discharge region R of the nozzle 141.

Vapor supplied from the vapor supplying unit 201 is distributed from first distributing routes 42 including the individual distributing routes 42a to 42c to the plurality of first discharge routes 46 to be discharged from the plurality of first discharge ports 45 to the delivery route 44. SPM liquid supplied from the SPM supplying unit 202 is distributed from the second distributing route 43 to the plurality of second discharge routes 48 to be discharged from the plurality of second discharge ports 47 to the delivery route 44.

The vapor discharged from the first discharge ports 45 and the SPM liquid discharged from the second discharge ports 47 are mixed at around an upper end that is an inlet of the delivery route 44 to be discharged toward the wafer W from a lower end that is an outlet of the delivery route 44.

In a case where the nozzle 141 is not provided with the delivery route 44, a droplet of SPM liquid discharged from the nozzle 141 may diffuse, so that there exists possibility that the SPM liquid is not appropriately mixed with vapor. Furthermore, there exists possibility that the diffused SPM liquid adheres to an inner wall of the chamber 101, thereby leading to contamination of the chamber 101 or the wafer W in the chamber 101.

In contrast, the nozzle 141 according to the embodiment includes the delivery route 44, so that it is possible to reduce a possibility that SPM liquid and vapor discharged from the first discharge port 45 diffuse without contacting therebetween. Accordingly, the nozzle 141 is capable of efficiently mixing the vapor and SPM liquid. Thus, the nozzle 141 according to the embodiment is capable of raising the temperature of SPM liquid higher than that in a case of a nozzle without the delivery route 44. Furthermore, it is possible to reduce contamination inside the chamber 101 due to diffusion of SPM liquid.

Configuration of Vapor Supplying Unit

Figure 7:
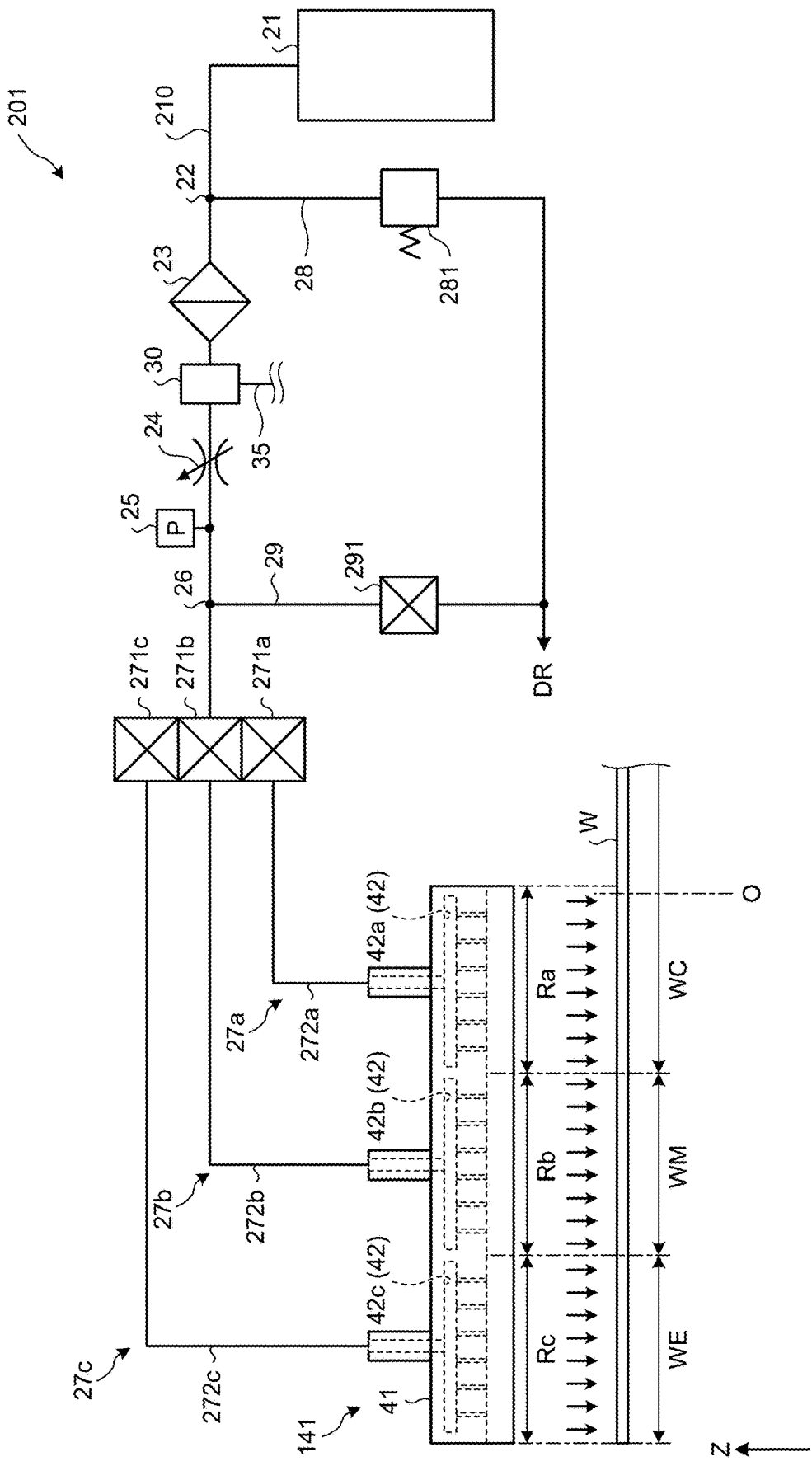
FIG. 7 is a schematic diagram illustrating a configuration example of a vapor supplying unit according to the embodiment.

A configuration of the vapor supplying unit 201 will be explained with reference to FIG. 7. FIG. 7 is a schematic diagram illustrating a configuration example of the vapor supplying unit 201 according to the embodiment.

As illustrated in FIG. 7, the vapor supplying unit 201 includes the vapor supplying route 210, a vapor generator 21, a branch portion 22, a filter 23, a needle valve 24, a pressure gauge 25 (P), a branch portion 26, and a plurality of individual supply units 27a to 27c. The vapor supplying unit 201 includes a separator 30.

For example, the vapor generator 21 vaporizes DIW so as to generate vapor. The vapor supplying route 210 is connected between the vapor generator 21 and the plurality of individual supply units 27a to 27c to supply the vapor generated by the vapor generator 21 to the individual supply units 27a to 27c.

The vapor supplying route 210 is equipped with the branch portion 22, the filter 23, the needle valve 24, the pressure gauge 25, and the branch portion 26 that are sequentially arranged in this order from the upstream side of the vapor supplying route 210. A first branch line 28 branches off from the branch portion 22. The first branch line 28 is connected to a drain part DR. A back pressure valve 281 is provided on the first branch line 28.

The back pressure valve 281 adjusts the valve opening degree when a pressure of the vapor at the branch portion 22 of the vapor supplying route 210 reaches a predetermined pressure, for example, 0.1 MPa, in order to prevent the vapor pressure at the branch portion 22 from becoming greater than the predetermined pressure.

The filter 23 removes contaminants, such as a particle included in the vapor at the vapor supplying route 210. The needle valve 24 adjusts its valve opening degree on the basis of a control signal from the controller 18 (see FIG. 1). The pressure gauge 25 measures a pressure of the vapor flowing through the vapor supplying route 210.

A second branch line 29 branches off from the branch portion 26. The second branch line 29 is connected to the drain part DR. A valve 291 is provided on the second branch line 29.

The individual supply unit 27a includes a valve 271a and the individual supply route 272a. The valve 271a is provided between the vapor supplying route 210 and the individual supply route 272a to switch a state between supply and supply stop from the vapor supplying route 210 to the individual supply route 272a. The individual supply route 272a is connected to the individual distributing route 42a so as to supply the vapor supplied from the vapor supplying route 210 via the valve 271a to the individual distributing route 42a.

The individual supply unit 27b includes a valve 271b and the individual supply route 272b. The valve 271b is provided between the vapor supplying route 210 and the individual supply route 272b to switch a state between supply and supply stop from the vapor supplying route 210 to the individual supply route 272b. The individual supply route 272b is connected to the individual distributing route 42b so as to supply the vapor supplied from the vapor supplying route 210 via the valve 271b to the individual distributing route 42b.

The individual supply unit 27c includes a valve 271c and the individual supply route 272c. The valve 271c is provided between the vapor supplying route 210 and the individual supply route 272c to switch a state between supply and supply stop from the vapor supplying route 210 to the individual supply route 272c. The individual supply route 272c is connected to the individual distributing route 42c so as to supply the vapor supplied from the vapor supplying route 210 via the valve 271c to the individual distributing route 42c. The valves 271a to 271c are examples of a fluid amount adjusting unit. The valves 271a to 271c are also examples of an individual adjusting unit.

Under a waiting state, which is a state before processing the wafer W by using the process unit 16, the controller 18 (see FIG. 1) controls the valves 271a to 271c to close, and further controls the valve 291 to open. As a result, vapor generated in the vapor supplying unit 201 is discharged into the drain part DR via the branch portion 22, the filter 23, the needle valve 24, the pressure gauge 25, the branch portion 26, the second branch line 29, and the valve 291.

In a case where the pressure of the vapor generated at the vapor generator 21 is higher than a predetermined pressure, the back pressure valve 281 is in an open state. As a result, vapor generated by the vapor generator 21 is discharged into the drain part DR via the branch portion 22, the first branch line 28, and the back pressure valve 281.

Subsequently, in a case where starting to process the wafer W, the controller 18 controls at least one of the valves 271a to 271c to open and further controls the valve 291 to close. As a result, the vapor generated by the vapor generator 21 is supplied to the nozzle 141 via the branch portion 22, the filter 23, the needle valve 24, the pressure gauge 25, the branch portion 26, and the at least one of the valves 271a to 271c that is in the open state.

In parallel with the process for supplying the vapor to the nozzle 141, the controller 18 controls the SPM supplying unit 202 (see FIG. 2) to supply SPM liquid to the nozzle 141. As a result, the controller 18 is capable of discharging the mixed fluid of vapor and SPM liquid from the nozzle 141 to the wafer W.

In parallel with the process for discharging the mixed fluid to the wafer W, the controller 18 feedback-controls a valve opening degree of the needle valve 24 in such a manner that a pressure detected by the pressure gauge 25 becomes a predetermined pressure. As a result, the pressure in the vapor supplying route 210 can be maintained at a pressure corresponding to a desired discharge temperature, so that it is possible to maintain a discharge temperature of the mixed fluid to be discharged from the nozzle 141 at the desired discharge temperature.

As illustrated in FIG. 7, mixed fluid to be discharged from the individual discharge region Ra is supplied to the center region WC including a center portion of an upper surface of the wafer W. The mixed fluid to be discharged from the individual discharge region Rc is supplied to the peripheral region WE including a peripheral portion of the upper surface of the wafer W. The mixed fluid to be discharged from the individual discharge region Rb is supplied to the middle region WM located between the center region WC and the peripheral region WE of the upper surface of the wafer W. The individual discharge region Ra is an example of the center discharge region corresponding to the center region WC that includes the center portion of the wafer W among a plurality of within-wafer regions. The individual discharge region Rc is an example of the peripheral discharge region corresponding to the peripheral region WE that includes the peripheral portion of the wafer W among the plurality of within-wafer regions. The symbol "O" in FIG. 7 indicates a central axis of the wafer W.

The separator 30 separates a droplet from vapor flowing through the vapor supplying route 210. The separator 30 may be located, for example, at a position downstream of the filter 23 and upstream of the needle valve 24. The separator 30 may be also located, for example, at a position downstream of the branch portion 26 and upstream of the valves 271a to 271c.

Figure 8:
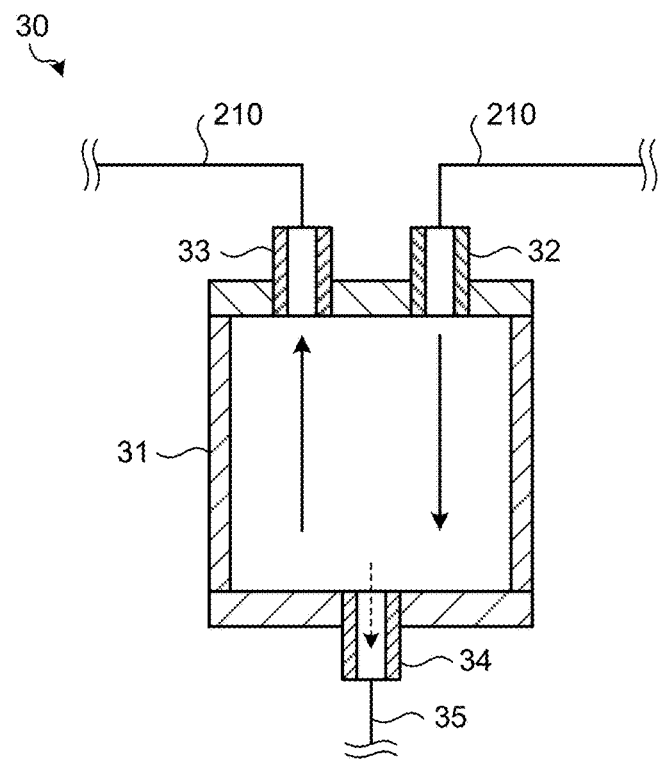
FIG. 8 is a diagram illustrating one example of a separator according to the embodiment.
Figure 9:
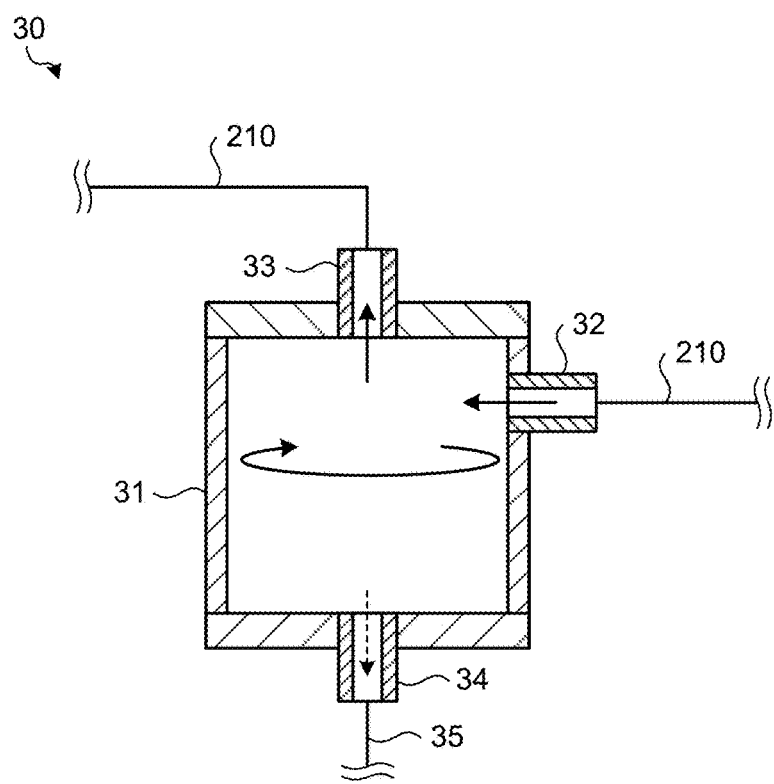
FIG. 9 is a diagram illustrating another example of the separator according to the embodiment.

FIG. 8 is a diagram illustrating one example of a separator according to the embodiment. FIG. 9 is a diagram illustrating another example of the separator according to the embodiment. As illustrated in FIGS. 8 and 9, the separator 30 includes a housing part 31 having an internal space, a leading-in port 32 and a leading-out port 33 for vapor, and a discharge port 34 for droplets. The leading-in port 32 and the leading-out port 33 are connected to the vapor supplying route 210. The discharge port 34 is connected to a liquid discharging passage 35.

Vapor is introduced from the vapor supplying route 210 located upstream of the separator 30 to the housing part 31 via the leading-in port 32. The vapor introduced to the housing part 31 is lead out to the vapor supplying route 210 located downstream of the separator 30. In a case where the vapor includes a droplet, the droplet is separated from the vapor in the housing part 31 to be discharged to the liquid discharging passage 35 via the discharge port 34.

According to the separator 30 illustrated in FIG. 8, for example, the leading-in port 32 and the leading-out port 33 are provided in a ceiling portion of the housing part 31, and the discharge port 34 is provided in a bottom portion of the housing part 31. A droplet introduced together with vapor from the leading-in port 32 into the housing part 31 is separated from vapor in the housing part 31 by a self-weight thereof. The droplet separated from vapor is discharged from the discharge port 34 provided in the bottom portion of the housing part 31 to the liquid discharging passage 35. According to the separator 30 illustrated in FIG. 9, the leading-in port 32 is provided at the side of the upper portion of the housing part 31, the leading-out port 33 is provided in the ceiling portion of the housing part 31, and the discharge port 34 is provided in the bottom portion of the housing part 31. The above-mentioned separator 30 generates a rotational flow or swirl of vapor inside the housing part 31, so that it is possible to reliably separate a droplet from the vapor.

Dew condensation water may occur in the vapor supplying route 210 in some cases. If dew condensation water exists in the vapor supplying route 210, there exists possibility that the dew condensation water and SPM liquid reacts with each other so as to generate bumping. Such bumping may generate splash so as to contaminate the inside of the chamber 101. On the other hand, the vapor supplying route 210 according to the embodiment is provided with the separator 30 to be capable of removing dew condensation water from vapor before the vapor reaches the nozzle 141. Therefore, the vapor supplying unit 201 according to the embodiment is capable of reducing occurrence of bumping due to reaction between dew condensation water and SPM liquid, and occurrence of splash due to the above-mentioned bumping.

Specific Operation of Process Unit

Figure 10:
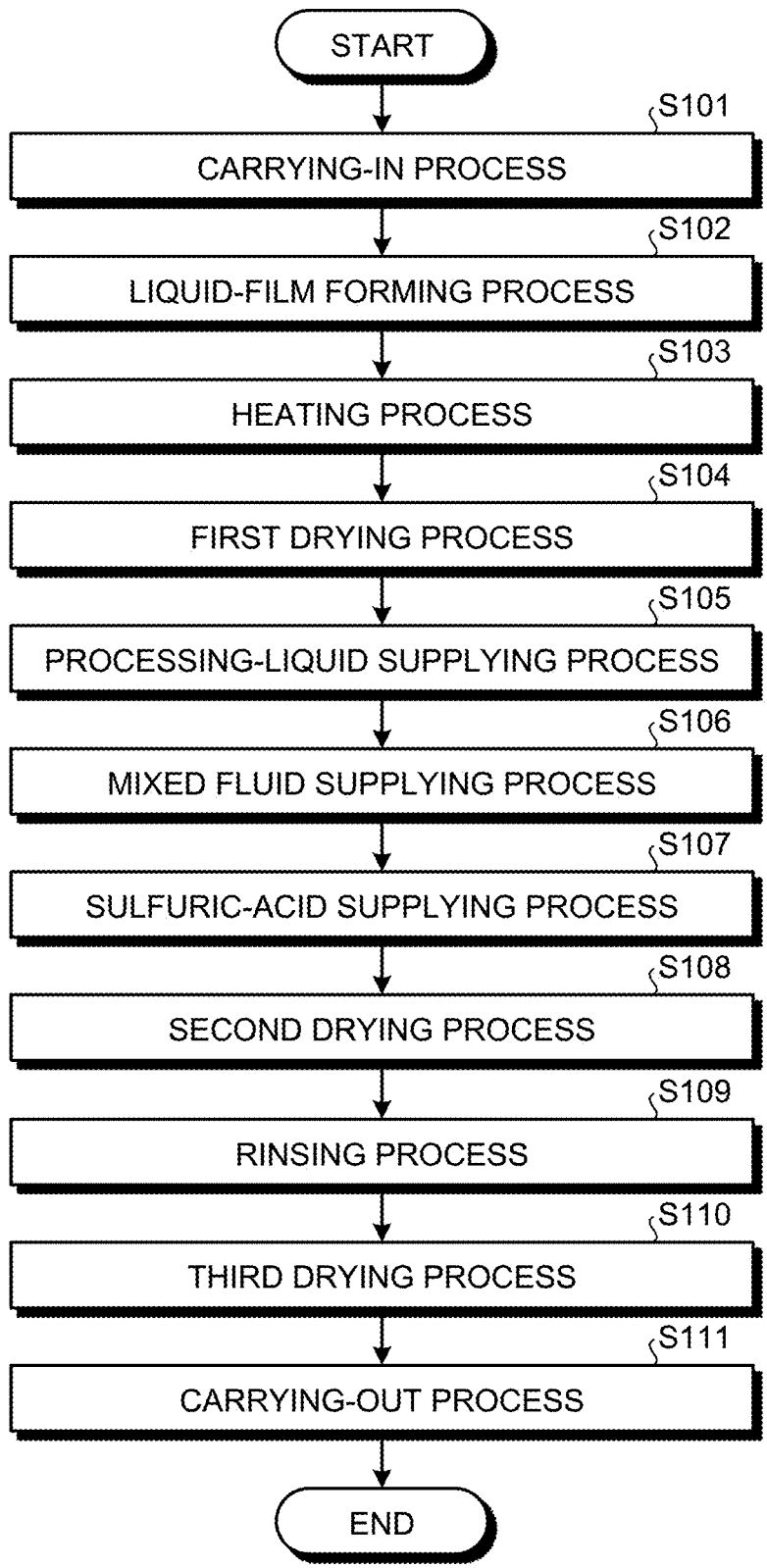
FIG. 10 is a flowchart illustrating a processing procedure to be executed by a process unit according to the embodiment.

Next, specific operations of the process unit 16 will be explained with reference to FIG. 10. FIG. 10 is a flowchart illustrating a processing procedure to be executed by the process unit 16 according to the embodiment. A series of processes illustrated in FIG. 10 is executed in accordance with control by the controller 18.

In the process unit 16, a carrying-in process of the wafer W is executed (Step S101). Specifically, the substrate transfer device 17 carries the wafer W into the chamber 101 (see FIG. 1) of the process unit 16, and further causes the substrate holding unit 102 to hold it. Next, the process unit 16 rotates the substrate holding unit 102 at a predetermined rotational speed.

Next, in the process unit 16, a liquid-film forming process is executed (Step S102). In the liquid-film forming process, the second turning/lifting mechanism 153 (see FIG. 2) moves the rinse nozzle 151 from a standby position to a processing position above the wafer W. Next, DIW is discharged toward an upper surface of the wafer W from the rinse nozzle 151. DIW discharged on the wafer W is spread over an upper surface of the wafer W by a centrifugal force of the rotating wafer W. Thus, a liquid film of DIW is formed on the upper surface of the wafer W.

Next, in the process unit 16, a heating process is executed (Step S103). The heating process is a process for heating the nozzle 141.

Specifically, the first turning/lifting mechanism 143 moves the nozzle 141 from a standby position to a processing position that is above the wafer W. Thus, a state is obtained where the individual discharge region Ra of the nozzle 141 is positioned above the center region WC of the wafer W, the individual discharge region Rb of the nozzle 141 is positioned above the middle region WM, and the individual discharge region Rc of the nozzle 141 is positioned above the peripheral region WE. Next, vapor is discharged toward a surface of the wafer W from the nozzle 141. During this time period, DIW is continuously discharged from the rinse nozzle 151.

As described above, vapor, in other words pressurized vapor of DIW, is discharged into an inner part of the nozzle 141, and thus the nozzle 141 can be heated so as to heat the nozzle 141, so that it is possible to prevent condensed water of the nozzle 141. In a case where condensed water presents in an inner part of the nozzle 141 when SPM liquid is supplied to the inner part of the nozzle 141 in a processing-liquid supplying process or a mixed fluid supplying process to be mentioned later, there presents possibility that the condensed water reacts with the SPM liquid so as to generate bumping. On the contrary, the nozzle 141 is heated to prevent condensed water, so that it is possible to prevent bumping. A flow volume of vapor discharged from the nozzle 141 in the heating process is constant between the individual discharge regions Ra to Rc.

Moreover, in a case where a liquid film is formed on the wafer W in the liquid-film forming process prior to the heating process, it is possible to prevent effects on the wafer W due to vapor discharged from the nozzle 141 during the heating process.

Next, in the process unit 16, a first drying process is executed (Step S104). In the first drying process, discharge of vapor from the nozzle 141 and discharge of DIW from the rinse nozzle 151 are stopped, and then the wafer W is rotated for a predetermined time interval so as to remove water remaining on the wafer W.

As described above, water remaining on the wafer W is removed, and thus it is possible to prevent SPM liquid, which is discharged toward the wafer W in a processing-liquid supplying process to be mentioned later, from reacting with water remaining on the wafer W to affect the wafer W.

Next, in the process unit 16, a processing-liquid supplying process is executed (Step S105). The processing-liquid supplying process is a process for supplying SPM liquid to the wafer W prior to a mixed fluid supplying process to be mentioned later. Specifically, in the processing-liquid supplying process, SPM liquid is discharged toward an upper surface of the wafer W from the nozzle 141.

In a mixed fluid supplying process to be mentioned later, mixed fluid of vapor and SPM liquid is discharged from the nozzle 141. In this case, if vapor is discharged prior to processing liquid toward the dried wafer W, there presents possibility that the discharged vapor affects the wafer W. On the contrary, a processing-liquid supplying process is executed prior to the mixed fluid supplying process, so that it is possible to prevent effects on the wafer W due to vapor.

Note that in the processing-liquid supplying process, sulfuric acid or hydrogen peroxide instead of SPM liquid may be discharged toward the wafer W. On the contrary, an inventor according to the present application verified by an experiment that in a case where sulfuric acid was supplied prior to hydrogen peroxide, liquid splashing of SPM liquid was generated. A cause of the above-mentioned liquid splashing was considered to be a phenomenon in which sulfuric acid and hydrogen peroxide reacted with each other inside the nozzle 141 so as to generate fizzing inside the nozzle 141, and thus SPM liquid was vigorously discharged from the nozzle 141 due to pressure increase caused by the fizzing. Moreover, an inventor according to the present application verified by an experiment that in a case where hydrogen peroxide was supplied prior to sulfuric acid, a large amount of fume was generated. A cause of the above-mentioned generation of fume was considered to be a phenomenon in which preliminarily-discharged hydrogen peroxide and SPM liquid, which was supplied after the hydrogen peroxide, reacted with each other. Based on the above results, SPM liquid is appropriate for liquid that is supplied to the wafer W prior to the mixed fluid supplying process.

The second discharge port 47 from which SPM liquid is discharged has a comparatively small diameter. Thus, in a case where SPM liquid is discharged at a high flow rate in the processing-liquid supplying process, there presents possibility that a flow velocity of SPM liquid becomes excessively large, thereby leading to generation of liquid splashing of SPM liquid on the wafer W. Thus, it is preferable that a flow volume of SPM liquid in the processing-liquid supplying process is set to be smaller than a flow volume of SPM liquid in a mixed fluid supplying process to be mentioned later.

Next, in the process unit 16, a mixed fluid supplying process is executed (Step S106). In the mixed fluid supplying process, mixed fluid of vapor and SPM liquid is discharged from the nozzle 141 toward a surface of the wafer W. Thus, a resist film formed on a surface of the wafer W is removed. In a case where the mixed fluid supplying process ends, the first turning/lifting mechanism 143 moves the nozzle 141 from a processing position to a standby position. Details of the mixed fluid supplying process will be mentioned later.

Next, in the process unit 16, a sulfuric-acid supplying process is executed (Step S107). In the sulfuric-acid supplying process, the second turning/lifting mechanism 153 (see FIG. 2) moves the rinse nozzle 151 from a standby position to a processing position that is above the wafer W. Next, sulfuric acid is discharged from the rinse nozzle 151 toward an upper surface of the wafer W. The sulfuric acid discharged on the wafer W is spread over the upper surface of the wafer W by a centrifugal force of the rotating wafer W.

SPM liquid remains in an inner part of the nozzle 141 after execution of the mixed fluid supplying process in some cases. SPM liquid has fizziness, and thus if SPM liquid remains in an inner part of the nozzle 141, there presents possibility that SPM liquid fizzes in an inner part of the nozzle 141 and liquid shortage of SPM liquid occurs in the inner part of the nozzle 141 due to the fizzing, so that SPM liquid drops from the nozzle 141 on the wafer W.

Therefore, if SPM liquid remaining in an inner part of the nozzle 141 is replaced with sulfuric acid in the sulfuric-acid supplying process, it is possible to prevent the SPM liquid from dropping from the nozzle 141 on the wafer W.

Note that in the sulfuric-acid supplying process, hydrogen peroxide instead of sulfuric acid may be employed. On the contrary, an inventor according to the present application verified by an experiment that in a case where sulfuric acid was replaced with hydrogen peroxide, hydrogen peroxide reacted with water to generate liquid splashing. Based on the above-mentioned result, sulfuric acid was appropriate for liquid to be replaced with SPM liquid remaining in an inner part of the nozzle 141.

Next, in the process unit 16, a second drying process is executed (Step S108). In the second drying process, in a case where discharge of vapor from the nozzle 141 is stopped, the wafer W is then rotated for a predetermined time interval so as to remove sulfuric acid that is remaining on the wafer W. Note that during execution of the second drying process, the second turning/lifting mechanism 153 moves the rinse nozzle 151 from a standby position to a processing position above the wafer W.

Next, in the process unit 16, a rinsing process is executed (Step S109). In the above-mentioned rinsing process, hydrogen peroxide is supplied from the rinse nozzle 151 toward a surface of the wafer W. Rinse liquid supplied to the wafer W is spread over a surface of the wafer W by a centrifugal force according to rotation of the wafer W. Thus, an upper surface of the wafer W is replaced with hydrogen peroxide.

As described above, in the process unit 16 according to the embodiment, in the rinsing process, hydrogen peroxide is supplied to the wafer W from the rinse nozzle 151 that is a nozzle different from the nozzle 141. Thus, it is possible to prevent liquid splashing due to bumping that is caused by reaction between water remaining in an inner part of the nozzle 141 and hydrogen peroxide. During the rinsing process, the controller 18 controls the first turning/lifting mechanism 143 so as to cause the nozzle 141 to move to a standby position. Moreover, after execution of the rinsing process, the controller 18 controls the second turning/lifting mechanism 153 so as to cause the rinse nozzle 151 to move to a standby position.

Next, in the process unit 16, a third drying process is executed (Step S110). In the third drying process, the controller 18 increases a rotational speed of the wafer W. Thus, rinse liquid remaining on the wafer W is removed so as to dry the wafer W. Next, rotation of the wafer W is stopped.

Next, in the process unit 16, a carrying-out process is executed (Step S111). In the carrying-out process, the wafer W held by the substrate holding unit 102 is passed to the substrate transfer device 17, and further is housed in the carrier C via the substrate transfer device 17, the delivery unit 14, and the substrate transfer device 13. When the above-mentioned carrying-out process is completed, substrate processing of the single wafer W is completed.

Specific Example of Mixed Fluid Supplying Process

Figure 11:
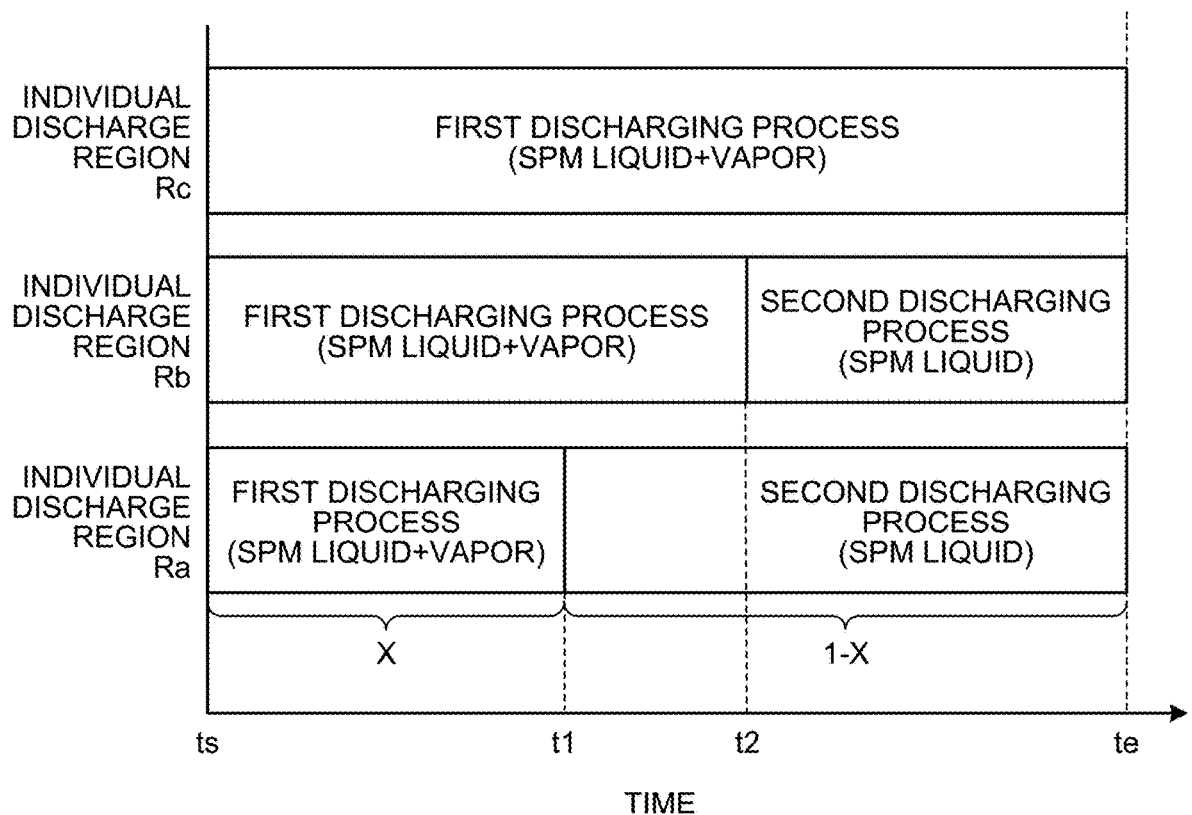
FIG. 11 is a diagram illustrating a specific example of a mixed fluid supplying process according to the embodiment.

Next, a specific example of the mixed fluid supplying process indicated in Step S102 will be explained with reference to FIG. 11. FIG. 11 is a diagram illustrating a specific example of the mixed fluid supplying process according to the embodiment. FIG. 11 is a diagram illustrating transition of a discharging process during a time period from a discharge starting time point (ts) to a discharge end time point (te) of mixed fluid in the mixed fluid supplying process.

The controller 18 (see FIG. 1) controls the valves 271a to 271c during the mixed fluid supplying process so as to adjust a ratio of vapor to SPM liquid for each of the individual discharge regions Ra to Rc. Herein, "ratio of vapor to SPM liquid" means a ratio of a total discharge amount of vapor to a total discharge amount of SPM liquid during a time period from a discharge starting time point (ts) to a discharge end time point (te) of mixed fluid.

Specifically, as illustrated in FIG. 11, the mixed fluid supplying process includes a first discharging process and a second discharging process. The first discharging process is a process for discharging mixed fluid of SPM liquid and vapor toward the wafer W. On the contrary, the second discharging process is a process for discharging SPM liquid toward the wafer W. In other words, the first discharging process is a process for mixing SPM liquid and vapor, and the second discharging process is a process for discharging SPM liquid alone without mixing SPM liquid and vapor.

The controller 18 individually controls the valves 271a to 271c so as to adjust a ratio between a time interval of the first discharging process and a time interval of the second discharging process, for each of the individual discharge regions Ra to Rc.

Specifically, the controller 18 controls the valves 271a to 271c such that a ratio of a time interval of the second discharging process to a total time interval (T) of a mixed fluid supplying process in the individual discharge region Rc is smaller than a ratio of a time interval of the second discharging process to a total time interval (T) of a mixed fluid supplying process in the individual discharge regions Ra and Rb. The controller 18 controls the valves 271a to 271c such that a ratio of a time interval of the second discharging process to a total time interval (T) of a mixed fluid supplying process in the individual discharge region Rb is smaller than a ratio of a time interval of the second discharging process to a total time interval (T) of a mixed fluid supplying process in the individual discharge region Ra. In other words, the controller 18 controls the valves 271a to 271c during the mixed fluid supplying process such that magnitude relationship of a ratio of a total discharge amount of vapor to a total discharge amount of SPM liquid is "center region WC<middle region WM<peripheral region WE".

For example, as illustrated in FIG. 11, the controller 18 controls the valve 271a and the valve 271b such that a second discharging process is executed after a first discharging process in the individual discharge region Ra and the individual discharge region Rb.

Specifically, in a case where a mixed fluid supplying process is started, the controller 18 opens the valve 271a so as to start a first discharging process for discharging mixed solution of SPM liquid and vapor from the individual discharge region Ra. Next, in a case where a predetermined time interval has elapsed since the start of discharging the mixed solution, the controller 18 closes the valve 271a. Thus, the first discharging process is ended, and a second discharging process for discharging SPM liquid from the individual discharge region Ra is started. Similarly, in a case where a mixed fluid supplying process is started, the controller 18 opens the valve 271b so as to start a first discharging process for discharging mixed solution of SPM liquid and vapor from the individual discharge region Rb. Next, in a case where a predetermined time interval has elapsed since the start of discharging the mixed solution, the controller 18 closes the valve 271b. Thus, the first discharging process is ended, and a second discharging process for discharging SPM liquid from the individual discharge region Rb is started.

The controller 18 starts a second discharging process of the individual discharge region Ra, and then further starts a second discharging process of the individual discharge region Rb. In other words, the controller 18 closes the valve 271a, and then further closes the valve 271b. Thus, a ratio of a time interval of the second discharging process to a total time interval (T) of a mixed fluid supplying process in the individual discharge region Rb can be smaller than a ratio of a time interval of the second discharging process to a total time interval (T) of a mixed fluid supplying process in the individual discharge region Ra.

The controller 18 sets a ratio of a time interval of the second discharging process to a total time interval (T) of a mixed fluid supplying process in the individual discharge region Rc to zero. In other words, a second discharging process is not executed in the individual discharge region Rc.

Assume that a flow volume of SPM liquid is constant during the mixed fluid supplying process. Moreover, among the individual discharge regions Ra to Rc, discharge start timings (ts) and discharge end timings (ts) thereof are the same.

In a substrate processing apparatus having a single wafer processing type, regarding a within-wafer temperature of the wafer W, a temperature of a peripheral portion of the wafer W tends to be lower than a temperature of a center portion of the wafer W. Thus, an etching rate of the peripheral region WE in a within-wafer region of the wafer W tends to be lower than an etching rate of the center region WC in the within-wafer region of the wafer W.

In a case where using a long nozzle, a bias in distribution of a within-wafer temperature of the wafer W can be reduced. Thus, an etching rate in the peripheral region WE can be increased. On the other hand, in a case where using a long nozzle, there presents possibility that an etching rate in the center region WC becomes excessively large, and as a result, a base film (for example, SiCN film) positioned under a resist film is excessively removed in the center region WC compared with another area. As described above, in a case where using a long nozzle, there presents possibility that a loss amount of a base film is uneven within a surface of the wafer W.

On the contrary, the process unit 16 according to the embodiment is capable of adjusting a ratio between a time interval of a first discharging process and a time interval of a second discharging process for each of the center region WC, the middle region WM, and the peripheral region WE. Specifically, the process unit 16 controls the valves 271a to 271c during a mixed fluid supplying process such that a time interval of a first discharging process sequentially decreases in the peripheral region WE, the middle region WM, and the center region WC in this order.

For example, in the example illustrated in FIG. 11, the controller 18 starts a first discharging process for all of the individual discharge regions Ra to Rc at a time point ts. Next, the controller 18 closes the valve 271a at a time point t1 so as to change a mixed fluid supplying process in the individual discharge region Ra, which is corresponding to the center region WC, into a second discharging process. Subsequently, the controller 18 closes the valve 271b at a time point t2 so as to change a mixed fluid supplying process in the individual discharge region Rb, which is corresponding to the middle region WM, into a second discharging process. The controller 18 ends at a time point to a mixed fluid supplying process in all of the individual discharge regions Ra to Rc. In other words, the controller 18 stops discharging SPM liquid from the individual discharge regions Ra and Rb, and further stops discharging mixed fluid from the individual discharge region Rc.

As described above, the process unit 16 according to the embodiment adjusts a ratio between a time interval of a first discharging process and a time interval of a second discharging process for each of the center region WC, the middle region WM, and the peripheral region WE to be capable of equalizing an etching rate within a surface of the wafer W. Moreover, in accordance with the above mentioned, the process unit 16 according to the embodiment is capable of preventing a case where a loss amount of a base film is uneven within a surface of the wafer W. Thus, in accordance with the process unit 16 according to the embodiment, it is possible to improve within wafer non-uniformity in a process for removing a removal target from a substrate.

Herein, one example of a method for deciding a ratio of a time interval of a second discharging process to a total time interval of a mixed fluid supplying process, in other words, a ratio of a discharge time interval of vapor to the total time interval of the mixed fluid supplying process will be explained.

A ratio of a discharge time interval of vapor to a total time interval of a mixed fluid supplying process can be decided on the basis of, for example, an etching amount of each of the areas, which is obtained by preliminarily executing a mixed fluid supplying process including a first discharging process alone and a mixed fluid supplying process including a second discharging process alone.

For example, assume that an etching rate in a case where a mixed fluid supplying process including a first discharging process alone is executed is "a", an etching rate in a case where a mixed fluid supplying process including a second discharging process alone is executed is "b", and a target etching rate is "A". The etching rates a and b are, for example, actually measured values, and are different for each of the areas (herein, areas are center region WC, middle region WM, and peripheral region WE). The target etching rate A is the same between the areas. The etching rate a (A/min) in a case where a mixed fluid supplying process including a first discharging process alone is executed is higher than the etching rate b (A/min) in a case where a mixed fluid supplying process including a second discharging process alone is executed.

Assume that a time interval of a first discharging process is "x" in a case where a total time interval (T) of a mixed fluid supplying process is "1". In this case, the target etching rate A can be expressed by "A=ax+b(1−x)". Based on the above-mentioned formula, the time interval x of the first discharging process in each of the individual discharge regions Ra to Rc can be obtained by "x=(A−b)/(a−b)".

Herein, an example has been described, in which a second discharging process is executed after execution of a first discharging process; however, the process unit 16 may execute the first discharging process after execution of the second discharging process.

First Modification

Figure 12:
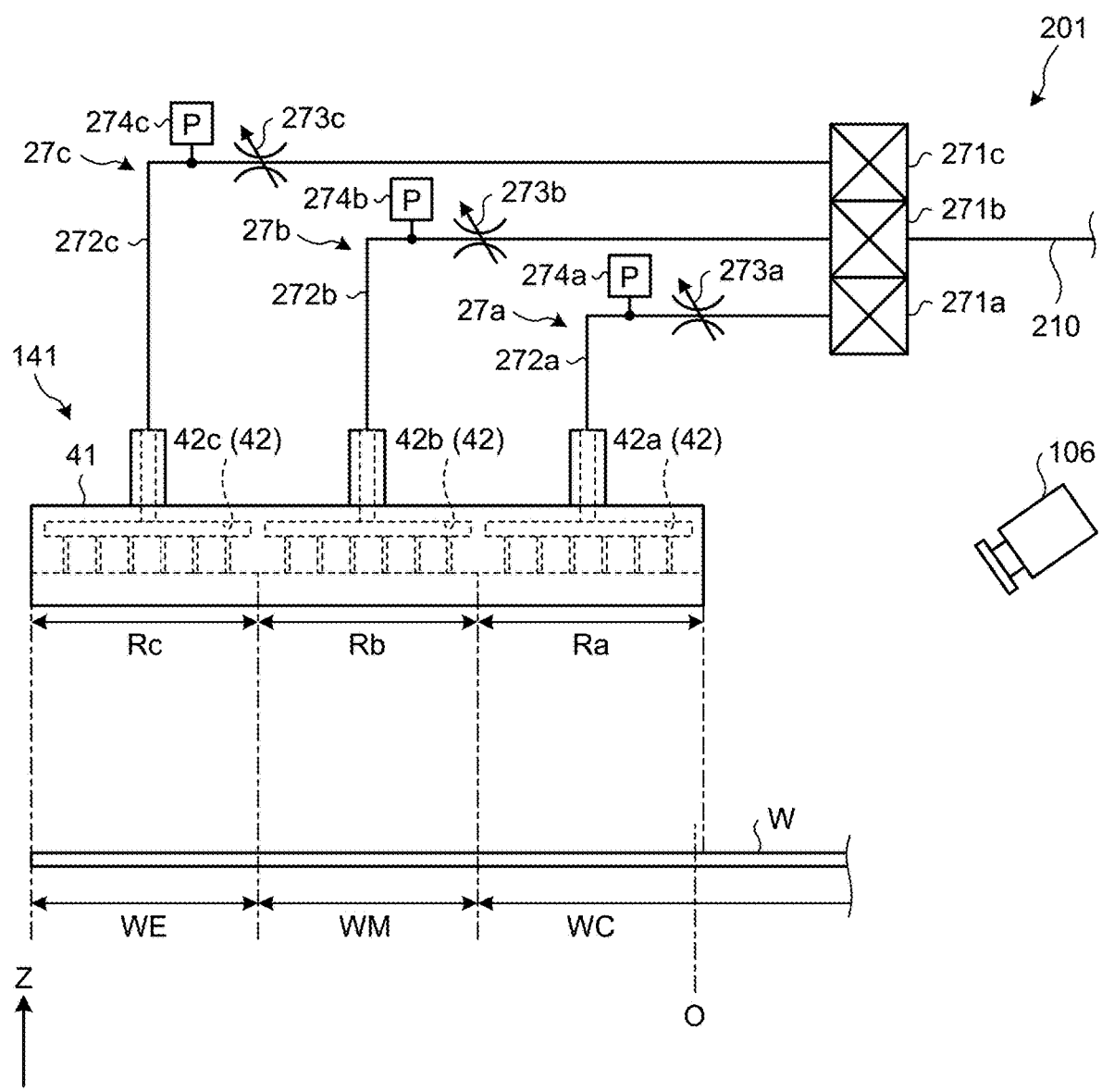
FIG. 12 is a schematic diagram illustrating a configuration example of a vapor supplying unit according to a first modification.

FIG. 12 is a schematic diagram illustrating a configuration example of a vapor supplying unit 201 according to a first modification. As illustrated in FIG. 12, the individual supply unit 27a may include a needle valve 273a and a pressure gauge 274a on the individual supply route 272a. Similarly, the individual supply unit 27b may include a needle valve 273b and a pressure gauge 274b on the individual supply route 272b. The individual supply unit 27c may include a needle valve 273c and a pressure gauge 274c on the individual supply route 272c. The needle valves 273a to 273c are examples of individual adjusting units. The process unit 16 may include a flow meter instead of the pressure gauges 274a to 274c.

The process unit 16 may include a temperature detecting unit 106. The temperature detecting unit 106 detects a within-wafer temperature of the wafer W.

The controller 18 may control the needle valves 273a to 273c during a mixed fluid supplying process on the basis of an accumulated value of the temperature that is detected by the temperature detecting unit 106 during the mixed fluid supplying process, so as to adjust a ratio of a time interval of a second discharging process to a total time interval of a mixed fluid supplying process for each of the individual discharge regions Ra to Rc.

For example, the controller 18 starts at the time point is a first discharging process in all of the individual discharge regions Ra to Rc. The controller 18 accumulates temperatures of each of the areas (herein, areas are center region WC, middle region WM, and peripheral region WE) which are detected by the temperature detecting unit 106 for each unit time interval (for example, 1 second). For example, in a case where a difference between an accumulated value of the temperature in the center region WC and an accumulated value of the temperature in the peripheral region WE exceeds an upper limit of a threshold range, the controller 18 controls the needle valve 273a so as to reduce a flow volume of vapor that is flowing through the individual supply route 272a. Thus, rise in temperature of the center region WC is prevented, so that it is possible to reduce difference between the temperature of the center region WC and the temperature of the peripheral region WE.

Similarly, in a case where a difference between an accumulated value of the temperature in the middle region WM and an accumulated value of the temperature in the peripheral region WE exceeds a threshold, the controller 18 controls the needle valve 273b so as to reduce a flow volume of vapor that is flowing through the individual supply route 272b. Thus, rise in temperature of the middle region WM is prevented, so that it is possible to reduce difference between the temperature of the middle region WM and the temperature of the peripheral region WE.

Herein, the needle valves 273a and 273b are explained to be controlled; however, the controller 18 may control the valves 271a and 271b. For example, in a case where a difference between an accumulated value of the temperature in the center region WC and an accumulated value of the temperature in the peripheral region WE exceeds an upper limit of a threshold range, the controller 18 may close the valve 271a so as to stop supplying vapor to the individual discharge region Ra. Similarly, in a case where a difference between an accumulated value of the temperature in the middle region WM and an accumulated value of the temperature in the peripheral region WE exceeds an upper limit of a threshold range, the controller 18 may close the valve 271b so as to stop supplying vapor to the individual discharge region Rb.

Second Modification

In the above-mentioned embodiment and the first modification, an example is explained in which the valves 271a to 271c or the needle valves 273a to 273c are controlled during a mixed fluid supplying process so as to adjust a ratio of vapor to SPM liquid for each of the plurality individual discharge regions Ra to Rc. However, not limited thereto, the controller 18 may adjust a ratio of vapor to SPM liquid for each of the plurality of individual discharge regions Ra to Rc preliminarily, in other words, before starting a mixed fluid supplying process.

In this case, it is sufficient that the controller 18 controls the needle valves 273a to 273c so as to adjust an opening degree of the individual supply route 272a such that difference in an accumulated temperature during a time period from start until end of a mixed fluid supplying process becomes small between the center region WC, the middle region WM, and the peripheral region WE.

Specifically, it is sufficient that the controller 18 controls the needle valves 273a to 273c such that during a time period from start until end of a mixed fluid supplying process, a total amount of vapor supplied to the individual discharge region Rc is larger than a total amount of vapor supplied to the individual discharge region Ra. Moreover, it is sufficient that the controller 18 controls the needle valves 273a to 273c such that a total amount of vapor supplied to the individual discharge region Rb is larger than a total amount of vapor supplied to the individual discharge region Ra, and further is smaller than a total amount of vapor supplied to the individual discharge region Rc.

For one example, the controller 18 may adjust the needle valve 273a to the needle valve 273c such that an opening degree sequentially increases in the individual supply route 272a, the individual supply route 272b, and the individual supply route 272c in this order. Thus, a ratio of vapor to SPM liquid is adjusted for each of the plurality of individual discharge regions Ra to Rc, as a result, accumulated temperatures of the center region WC, the middle region WM, and the peripheral region WE during a time period from start until end of a mixed fluid supplying process are equalized. In other words, it is possible to equalize an etching amount between the center region WC, the middle region WM, and the peripheral region WE.

Third Modification

Figure 13:
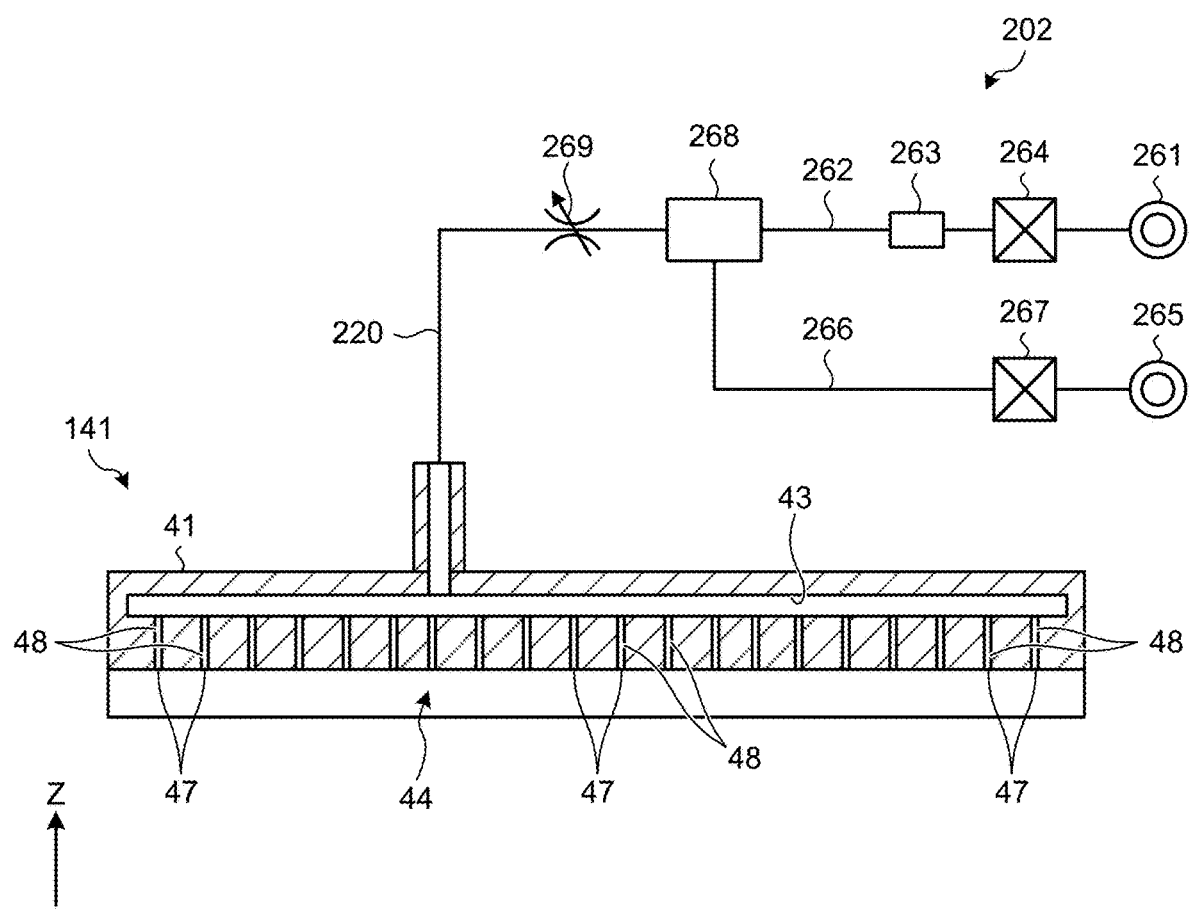
FIG. 13 is a schematic diagram illustrating a configuration example of an SPM supplying unit according to a third modification.

FIG. 13 is a schematic diagram illustrating a configuration example of an SPM supplying unit according to a third modification. As illustrated in FIG. 13, as a supply system of sulfuric acid, the SPM supplying unit 202 includes a sulfuric acid supply source 261, a sulfuric-acid supplying route 262, a temperature regulating unit 263, and a valve 264. The sulfuric acid supply source 261 supplies sulfuric acid having a normal temperature (namely, room temperature). The sulfuric-acid supplying route 262 connects the sulfuric acid supply source 261 and a mixing unit 268 to be mentioned later to each other. The temperature regulating unit 263 is a heater, for example, and further heats sulfuric acid that is flowing through the sulfuric-acid supplying route 262. The valve 264 opens/closes the sulfuric-acid supplying route 262. Note that the temperature regulating unit 263 may include COOLNICS (Registered Trademark) having a cooling function or the like.

As a supply system of hydrogen peroxide the SPM supplying unit 202 includes a hydrogen peroxide supply source 265, a hydrogen-peroxide supplying route 266, and a valve 267. The hydrogen peroxide supply source 265 supplies hydrogen peroxide having a normal temperature (namely, room temperature). The hydrogen-peroxide supplying route 266 connects the hydrogen peroxide supply source 265 and the mixing unit 268 to be mentioned later to each other, and further hydrogen peroxide supplied from the hydrogen peroxide supply source 265 flows through the hydrogen-peroxide supplying route 266. The valve 267 opens/closes the hydrogen-peroxide supplying route 266.

The SPM supplying unit 202 includes the mixing unit 268 and a needle valve 269. The mixing unit 268 mixes sulfuric acid supplied from the sulfuric-acid supplying route 262 and hydrogen peroxide supplied from the hydrogen-peroxide supplying route 266 with each other at a preset mixing ratio so as to generate SPM liquid that is mixed solution. The mixing unit 268 supplies the generated SPM liquid to the second distributing route 43 of the nozzle 141 via the SPM supplying route 220. The needle valve 269 is arranged on the SPM supplying route 220. The needle valve 269 adjusts a valve opening degree on the basis of a control signal transmitted from the controller 18 (see FIG. 1). The needle valve 269 is one example of a processing-liquid-volume adjusting unit.

As described above, the SPM supplying unit 202 according to the third modification is configured to be capable of adjusting a flow volume of SPM liquid to be supplied to the nozzle 141.

Figure 14:
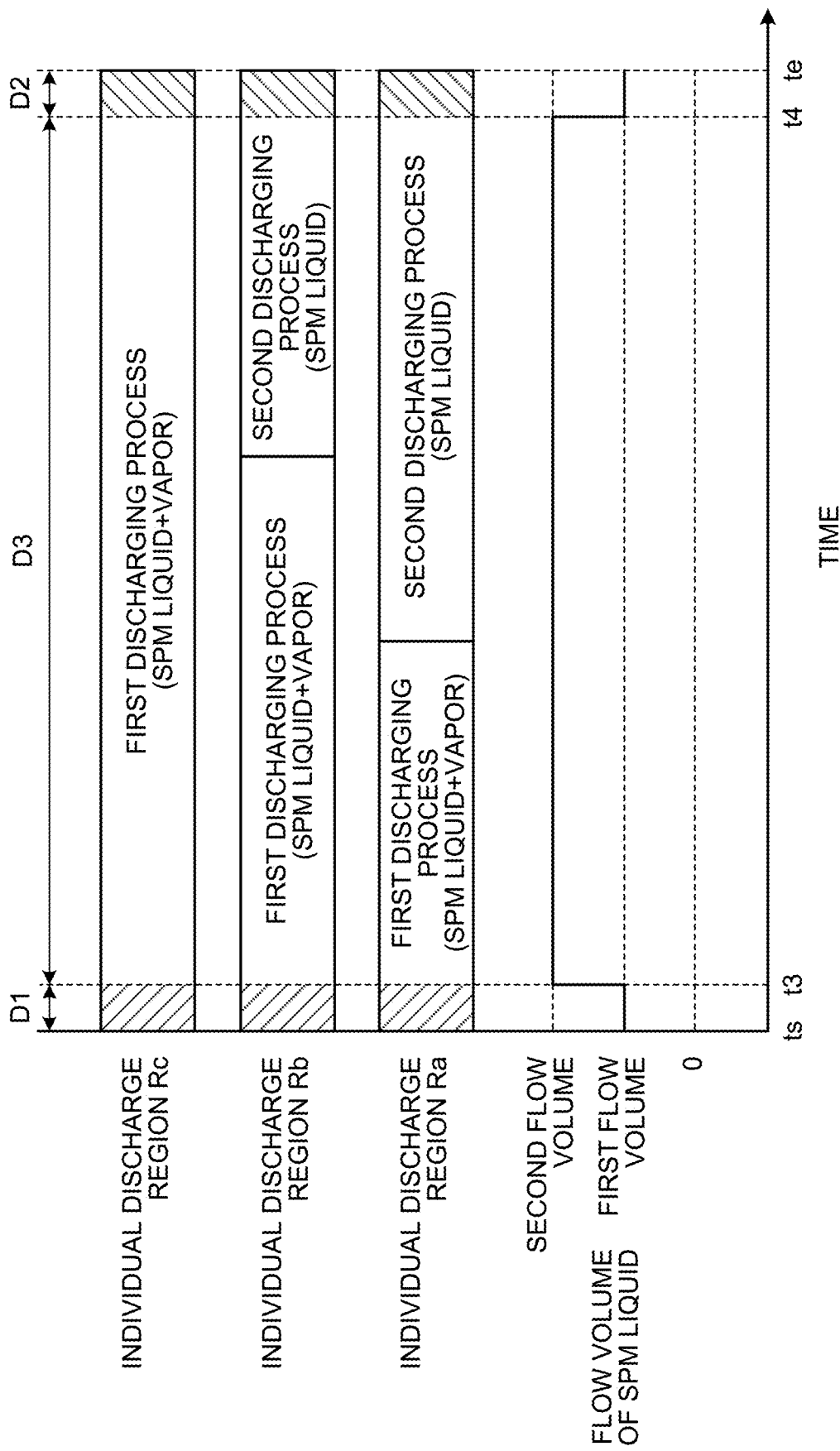
FIG. 14 is diagram illustrating a specific example of a mixed fluid supplying process according to the third modification.

FIG. 14 is a diagram illustrating a specific example of mixed fluid supplying processes according to the third modification. As illustrated in FIG. 14, in the mixed fluid supplying process, a time period including a start time point (ts) of the mixed fluid supplying process is indicated as a first time interval D1. In the mixed fluid supplying process, a time period including a discharge end time point (te) of the mixed fluid supplying process is indicated as a second time interval D2. In the mixed fluid supplying process, a time period from an end time point (t3) of the first time interval D1 until a start time point (t4) of the second time interval D2 is indicated as a third time interval D3.

The controller 18 may control the needle valve 269 such that a supply flow volume of SPM liquid during the first time interval D1 and the second time interval D2 is smaller than a supply flow volume of SPM liquid during the third time interval D3. For example, a first flow volume that is a supply flow volume of SPM liquid during the first time interval D1 and the second time interval D2 may be equal to or less than a half of a second flow volume that is a supply flow volume of SPM liquid during the third time interval D3.

The second discharge port 47 from which SPM liquid is discharged has a comparatively small diameter. Thus, in a case where SPM liquid is discharged at a high flow rate in a mixed fluid supplying process, a flow velocity of SPM liquid becomes excessively large, and there presents possibility of splashing of SPM liquid on the wafer W. Thus, the controller 18 may reduce a supply flow volume of SPM liquid for a predetermined time interval (first time interval D1) just after start of supplying SPM liquid in a mixed fluid supplying process and a predetermined time interval (second time interval D2) before end of supplying SPM liquid. Thus, it is possible to prevent splashing of SPM liquid.

Fourth Modification

Figure 15:
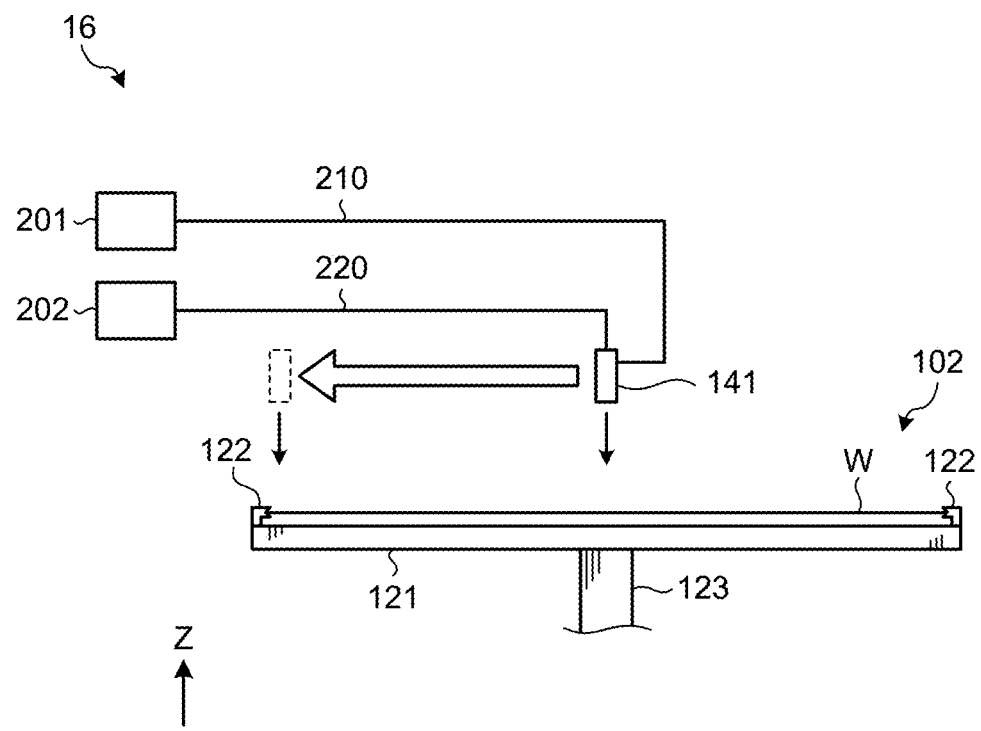
FIG. 15 is a schematic side view illustrating a configuration of a nozzle according to a fourth modification.

FIG. 15 is a schematic side view illustrating a configuration of the nozzle 141 according to a fourth modification. As illustrated in FIG. 15, the process unit 16 may include the nozzle 141 that discharges fluid (SPM liquid or mixed fluid) from the ordinary nozzle 141, specifically, an ordinary single discharge port that is circular-shaped in planar view. As the nozzle 141 as described above, for example, a two-flued nozzle having an internal mixing type, which mixes vapor supplied from the vapor supplying unit 201 and SPM liquid supplied from the SPM supplying unit 202 inside thereof, may be employed.

The nozzle 141 is capable of horizontally moving between a center portion and a peripheral portion of the wafer W by the first supply mechanism 104 (one example of moving unit). The vapor supplying unit 201 connected to the nozzle 141 does not include the individual supply units 27a to 27c, and the nozzle 141 is connected with a leading end of the vapor supplying route 210.

In a mixed fluid supplying process, the controller 18 discharges mixed fluid from the nozzle 141 while controlling the first supply mechanism 104 to move the nozzle 141 in a horizontal direction, so as to supply mixed fluid to the wafer W. In this case, during movement of the nozzle 141, the controller 18 controls the needle valve 24 (see FIG. 7) and adjusts a flow volume of vapor flowing through the vapor supplying route 210 so as to adjust a ratio of vapor to SPM liquid. In this case, the needle valve 24 is one example a flow-volume adjusting unit.

Specifically, the controller 18 controls the needle valve 24 such that a supply amount of vapor to the peripheral region WE of the wafer W is larger than a supply amount of vapor to the center region WC of the wafer W, so as to adjust a ratio of vapor to SPM liquid. For example, during movement of the nozzle 141 from the peripheral region WE to the center region WC of the wafer W, the controller 18 controls the needle valve 24 so as to gradually reduce a ratio of vapor to SPM liquid. On the other hand, during movement of the nozzle 141 form the center region WC to the peripheral region WE of the wafer W, the controller 18 controls the needle valve 24 so as to gradually increase a ratio of vapor to SPM liquid. Assume that a flow volume of SPM liquid during a mixed fluid supplying process is constant.

Thus, it is possible to equalize an etching amount within a surface of the wafer W. In other words, it is possible to improve within wafer non-uniformity of a process for removing a removal target (herein, resist film) from the wafer W.

Another Modification

In the above-mentioned embodiment and modifications, an example is explained in which vapor and SPM liquid are mixed; however, mist may be used instead of vapor. In other words, instead of the vapor supplying unit 201, a mist supplying unit that supplies mist of pressurized deionized water may be provided.

In the above-mentioned embodiment and modifications, a substrate processing apparatus is exemplified, which removes a resist film formed on a surface of a substrate. In other words, an example is explained in which a removal target of the mixed fluid supplying process is a resist film. However, a removal target of the mixed fluid supplying process is not limited to a resist film. For example, the removal target of the mixed fluid supplying process may be a residue (for example, organic substance) remaining after ashing. Moreover, the removal target of the mixed fluid supplying process may be unwanted substances included in an abrasive after execution of chemical mechanical polishing (CMP).

It is not necessary that a length of a long nozzle is nearly equal to a radius of the wafer W. In other words, a length of the long nozzle may be shorter than a radius of the wafer W.

As described above, a substrate processing apparatus (for example, process unit 16) according to the embodiment includes a substrate holding unit (for example, substrate holding unit 102), a fluid supplying unit (for example, vapor supplying unit 201), a processing-liquid supplying unit (for example, SPM supplying unit 202), a nozzle (for example, nozzle 141), a fluid amount adjusting unit (for example, valves 271a to 271c, needle valve 24, and needle valves 273a to 273c), and a controller (for example, controller 18). The substrate holding unit holds a substrate (for example, wafer W) to be rotatable. The fluid supplying unit supplies fluid including pressurized vapor (for example, vapor) or mist of deionized water. The processing-liquid supplying unit supplies processing liquid including at least a sulfuric acid. The nozzle is connected to the fluid supplying unit and the processing-liquid supplying unit to discharge mixed fluid of the fluid and the processing liquid toward the substrate. The fluid amount adjusting unit adjusts a flow volume of the fluid that is flowing through the fluid supplying unit. The controller controls the fluid amount adjusting unit. The controller is configured to control the fluid amount adjusting unit to adjust a ratio of the fluid to the processing liquid.

Thus, in accordance with the substrate processing apparatus according to the embodiment, it is possible to improve within wafer non-uniformity of a process for removing a removal target from a substrate.

According to the present disclosure, it is possible to improve within wafer non-uniformity of a process for removing a removal target from a substrate.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A substrate processing apparatus, comprising:
a substrate holding unit that holds a substrate to be rotatable;
a fluid supplying unit that supplies fluid including pressurized vapor or mist of deionized water;
a processing-liquid supplying unit that supplies processing liquid including at least sulfuric acid;
a nozzle that is connected to the fluid supplying unit and the processing-liquid supplying unit to discharge mixed fluid of the fluid and the processing liquid toward the substrate;
a fluid amount adjusting unit that adjusts a flow volume of the fluid that is flowing through the fluid supplying unit; and
a controller that controls the fluid amount adjusting unit to adjust a ratio of the fluid to the processing liquid, wherein
the nozzle includes a long nozzle that extends along a horizontal direction,
the substrate processing apparatus further comprises a second nozzle in addition to the long nozzle, and
the controller is further configured to:
prior to a mixed fluid supplying process for supplying the mixed fluid to the substrate from the nozzle, execute a liquid-film forming process for supplying deionized water to the substrate from the second nozzle to form a liquid film of the deionized water on a surface of the substrate, and then supply the vapor or the mist from the nozzle to the substrate on which the liquid film is formed to execute a heating process for heating the nozzle.

2. The substrate processing apparatus according to claim 1, wherein
the fluid supplying unit includes a plurality of individual supply units each of which individually supplies the fluid,
the nozzle linearly extends along the horizontal direction, and
the substrate processing apparatus further comprises:
a processing liquid distributing route that is connected to the processing-liquid supplying unit to distribute the processing liquid to a whole of discharge region of the mixed fluid discharged from the nozzle; and
a plurality of individual distributing routes that are connected to the plurality of individual supply units to distribute the fluid to a plurality of individual discharge regions that section the whole of discharge region along an extending direction of the nozzle.

3. The substrate processing apparatus according to claim 2, wherein
the fluid amount adjusting unit includes:
a plurality of individual adjusting units that correspond to the plurality of individual supply units to adjust a flow volume of the fluid flowing through the plurality of individual discharge regions, and
the controller is further configured to:
control the plurality of individual adjusting units to adjust the ratio of the fluid to the processing liquid for each of the plurality of individual discharge regions.

4. The substrate processing apparatus according to claim 3, wherein the controller is further configured to:
control the plurality of individual adjusting units such that, during a time period from a start until an end of a process using the mixed fluid, a difference in an accumulated temperature is small between a plurality of within-wafer regions of the substrate corresponding to the plurality of individual discharge regions; and
adjust the ratio of the fluid to the processing liquid for each of the plurality of individual discharge regions.

5. The substrate processing apparatus according to claim 4, wherein
the plurality of individual discharge regions include:
a center discharge region that corresponds to a center region including a center portion of the substrate among the plurality of within-wafer regions; and
a peripheral discharge region that corresponds to a peripheral region including a peripheral portion of the substrate among the plurality of within-wafer regions, and
the controller is further configured to:
control the plurality of individual adjusting units such that a total amount of the fluid supplied to the peripheral discharge region during the time period is larger than a total amount of the fluid supplied to the center discharge region during the time period.

6. The substrate processing apparatus according to claim 3, wherein
the controller is further configured to:
control the plurality of individual adjusting units during the process using the mixed fluid to adjust the ratio of the fluid to the processing liquid for each of the plurality of individual discharge regions.

7. The substrate processing apparatus according to claim 6, wherein the process using the mixed fluid includes:
a first discharging process for discharging the mixed fluid; and
a second discharging process for discharging the processing liquid, and the controller is further configured to:
control the plurality of individual adjusting units during the process using the mixed fluid to adjust a ratio of a time interval of the second discharging process to a total time interval of the process using the mixed fluid for each of the plurality of individual discharge regions.

8. The substrate processing apparatus according to claim 7, wherein the plurality of individual discharge regions include:
a center discharge region that corresponds to a center region including a center portion of the substrate among a plurality of within-wafer regions of the substrate corresponding to the plurality of individual discharge regions; and
a peripheral discharge region that corresponds to a peripheral region including a peripheral portion of the substrate among the plurality of within-wafer regions, and the controller is further configured to:
control the plurality of individual adjusting units during the process using the mixed fluid; and
control the plurality of individual adjusting units during the process using the mixed fluid such that a ratio of the time interval of the second discharging process to the total time interval of the process using the mixed fluid in the peripheral discharge region is smaller than a ratio of the time interval of the second discharging process to a total time interval of the process using the mixed fluid in the center discharge region.

9. The substrate processing apparatus according to claim 8, wherein
the controller is further configured to:
set a ratio of the time interval of the second discharging process to the total time interval of the process using the mixed fluid in the peripheral discharge region to zero.

10. The substrate processing apparatus according to claim 7, further comprising: a temperature detecting unit that detects a temperature of the substrate, wherein the controller is further configured to:
control the plurality of individual adjusting units during the process using the mixed fluid based on an accumulated value of a temperature that is detected by the temperature detecting unit during the process using the mixed fluid; and
adjust a ratio of the time interval of the second discharging process to the total time interval of the process using the mixed fluid for each of the plurality of individual discharge regions.

11. The substrate processing apparatus according to claim 1, further comprising:
a moving unit that moves the nozzle in the horizontal direction, wherein the controller is further configured to:
control the fluid amount adjusting unit while controlling the moving unit to move the nozzle; and
adjust the ratio of the fluid to the processing liquid.

12. The substrate processing apparatus according to claim 11, wherein:
the controller is further configured to:
control the fluid amount adjusting unit to adjust the ratio of the fluid to the processing liquid while controlling the moving unit to move the nozzle such that a supply amount of the fluid to a peripheral region including a peripheral portion of the substrate is larger than a supply amount of the fluid to a center region including a center portion of the substrate.

13. The substrate processing apparatus according to claim 1, wherein
the nozzle linearly extends along the horizontal direction, and
the controller is further configured to:
execute a processing-liquid supplying process for supplying the processing liquid to the substrate from the nozzle prior to the mixed fluid supplying process for supplying the mixed fluid to the substrate from the nozzle.

14. The substrate processing apparatus according to claim 1, wherein
the nozzle linearly extends along the horizontal direction,
the processing liquid includes mixed solution of sulfuric acid and hydrogen peroxide, and
the controller is further configured to:
execute the mixed fluid supplying process for supplying the mixed fluid to the substrate from the nozzle, and then execute a sulfuric-acid supplying process for supplying sulfuric acid to the substrate from the nozzle.

15. The substrate processing apparatus according to claim 1, wherein
the processing liquid includes mixed solution of sulfuric acid and hydrogen peroxide, and
the controller is further configured to:
execute the mixed fluid supplying process for supplying the mixed fluid to the substrate from the long nozzle, and then execute a rinsing process for supplying hydrogen peroxide to the substrate from the second nozzle.

16. The substrate processing apparatus according to claim 1, further comprising:
a processing-liquid-amount adjusting unit that adjusts a flow volume of the processing liquid flowing through the processing-liquid supplying unit, wherein
the nozzle linearly extends along the horizontal direction, and
the controller is further configured to:
in the mixed fluid supplying process for supplying the mixed fluid to the substrate from the nozzle, control the processing-liquid-amount adjusting unit such that a supply flow volume of the processing liquid during a first time interval including a start time point of the mixed fluid supplying process and a second time interval including an end time point of the mixed fluid supplying process is smaller than a supply flow volume of the processing liquid during a third time interval from an end time point of the first time interval until a start time point of the second time interval.

17. The substrate processing apparatus according to claim 1, wherein:

the nozzle linearly extends along the horizontal direction, and the controller is further configured to:
supply the fluid to the substrate from the nozzle prior to the mixed fluid supplying process for supplying the mixed fluid to the substrate from the nozzle to execute the heating process for heating the nozzle.

18. The substrate processing apparatus according to claim 1, wherein
the fluid supplying unit includes a separator that separates a drop from the fluid.

19. A substrate processing method comprising:
providing the substrate processing apparatus according to claim 1,
holding the substrate to be rotatable;
discharging the mixed fluid to the substrate by using the nozzle that is connected to the fluid supplying unit and the processing-liquid supplying unit, the fluid supplying unit supplying the fluid including pressurized vapor or mist of deionized water, the processing-liquid supplying unit supplying the processing liquid including at least sulfuric acid, and the mixed fluid being mixed fluid of the fluid and the processing liquid; and
adjusting the flow volume of the fluid flowing through the fluid supplying unit by using the fluid amount adjusting unit, wherein
the adjusting includes controlling the fluid amount adjusting unit to adjust the ratio of the fluid to the processing liquid.

* * * * *